US008693705B2

(12) United States Patent
Miyazaki

(10) Patent No.: US 8,693,705 B2
(45) Date of Patent: Apr. 8, 2014

(54) RESPONSE WAVEFORM SYNTHESIS METHOD AND APPARATUS

(75) Inventor: Hideo Miyazaki, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 1628 days.

(21) Appl. No.: 11/703,036

(22) Filed: Feb. 5, 2007

(65) Prior Publication Data

US 2007/0185719 A1 Aug. 9, 2007

(30) Foreign Application Priority Data

Feb. 7, 2006 (JP) ................................ 2006-030096

(51) Int. Cl.
*H03G 5/00* (2006.01)

(52) U.S. Cl.
USPC ............... 381/98; 381/94.3; 84/604; 708/404

(58) Field of Classification Search
USPC ............. 381/1, 10, 300–307, 310, 58–59, 85, 381/332–334, 98–103, 94.1–94.3; 700/94; 708/300, 322, 403, 404, 405; 84/604
See application file for complete search history.

(56) References Cited

U.S. PATENT DOCUMENTS

| | | | | |
|---|---|---|---|---|
| 4,165,797 | A | 8/1979 | Spetalnik | |
| 5,572,443 | A * | 11/1996 | Emoto et al. | 702/103 |
| 5,597,970 | A | 1/1997 | Sato et al. | |
| 5,703,955 | A | 12/1997 | Fels | |
| 5,864,806 | A | 1/1999 | Mokbel et al. | |
| 6,408,079 | B1 * | 6/2002 | Katayama et al. | 381/98 |
| 6,574,339 | B1 * | 6/2003 | Kim et al. | 381/17 |
| 7,630,500 | B1 * | 12/2009 | Beckman et al. | 381/18 |
| 7,715,575 | B1 * | 5/2010 | Sakurai et al. | 381/309 |
| 2004/0015359 | A1 | 1/2004 | Sato et al. | |
| 2004/0165737 | A1 | 8/2004 | Monro | |
| 2006/0013422 | A1 * | 1/2006 | Goorevich et al. | 381/312 |

FOREIGN PATENT DOCUMENTS

| | | |
|---|---|---|
| EP | 1355514 | 10/2003 |
| EP | 1458218 | 9/2004 |
| JP | 06-332479 | 2/1994 |
| JP | 06-332479 A | 12/1994 |
| JP | 08-338755 | 12/1996 |
| JP | 08-338755 A | 12/1996 |
| JP | 9-149500 | 6/1997 |
| JP | 11-055782 A | 2/1999 |

(Continued)

OTHER PUBLICATIONS

Title: On the Use of Windows for Harmonic Analysis with the Discrete Fourier Transform Author: Frederic J Harris Paper: Proceedings of the IEEE vol. 66 No. 1 Jan. 1978.*

(Continued)

*Primary Examiner* — Xu Mei
(74) *Attorney, Agent, or Firm* — Morrison & Foerster LLP

(57) ABSTRACT

Using frequency characteristics determined for individual ones of a plurality of analyzed bands of a predetermined audio frequency range with frequency resolution that becomes finer in order of lowering frequencies of the analyzed bands, a synthesized band is set for each one or for each plurality of the analyzed bands, and then a time-axial response waveform is determined for each of the synthesized bands. The response waveforms of the synthesized bands are then added together to thereby provide a response waveform for the whole of the audio frequency range.

14 Claims, 13 Drawing Sheets

(56) References Cited

FOREIGN PATENT DOCUMENTS

| | | | |
|---|---|---|---|
| JP | 11202883 | | 7/1999 |
| JP | 2002-123262 | | 4/2002 |
| JP | 2002-123262 | A | 4/2002 |
| JP | 2002-366162 | | 12/2002 |
| JP | 2003-16138 | | 1/2003 |
| JP | 2005-49688 | | 2/2005 |
| KR | 100279710 | | 11/2000 |
| WO | WO-02/080146 | A1 | 10/2002 |

OTHER PUBLICATIONS

Japanese Office Action for JP-2006-030096, mailed Dec. 16, 2008, with English translation.

Chinese Office Action mailed Jun. 19, 2009, for CN Application No. 2007100031546, with English Translation, 11 pages.

Japanese Office Action mailed Mar. 10, 2009, for JP Application No. 2006-030096, with English Translation, four pages.

European Search Report mailed Jun. 13, 2007, for EP Application No. 07101735.4, four pages.

European Search Report mailed Oct. 23, 2007, for EP Application No. 07101735.4, 11 pages Japanese Office Action mailed Dec. 16, 2008, for JP Application No. 2006-030096, with English Translation, five pages.

Korean Office Action mailed Mar. 7, 2008, for KR Application No. 10-2007-0012105, with English Translation, eight pages.

"Acoustical Performance Partnership", by EAW, Copyright 2006 (URL: http://www.ear.com/APP/index.html).

Soundvision: L-Acoustics Professional Modeling Software, by L-Acoustics, (URL: http://www.1-acoustics.com/site-US/techpressna.htm#tech5), 2004.

Ease 4.1, by Renkus-Heinz, 2006, (URL: http:renkus-heinz.com/ease/index/html).

* cited by examiner

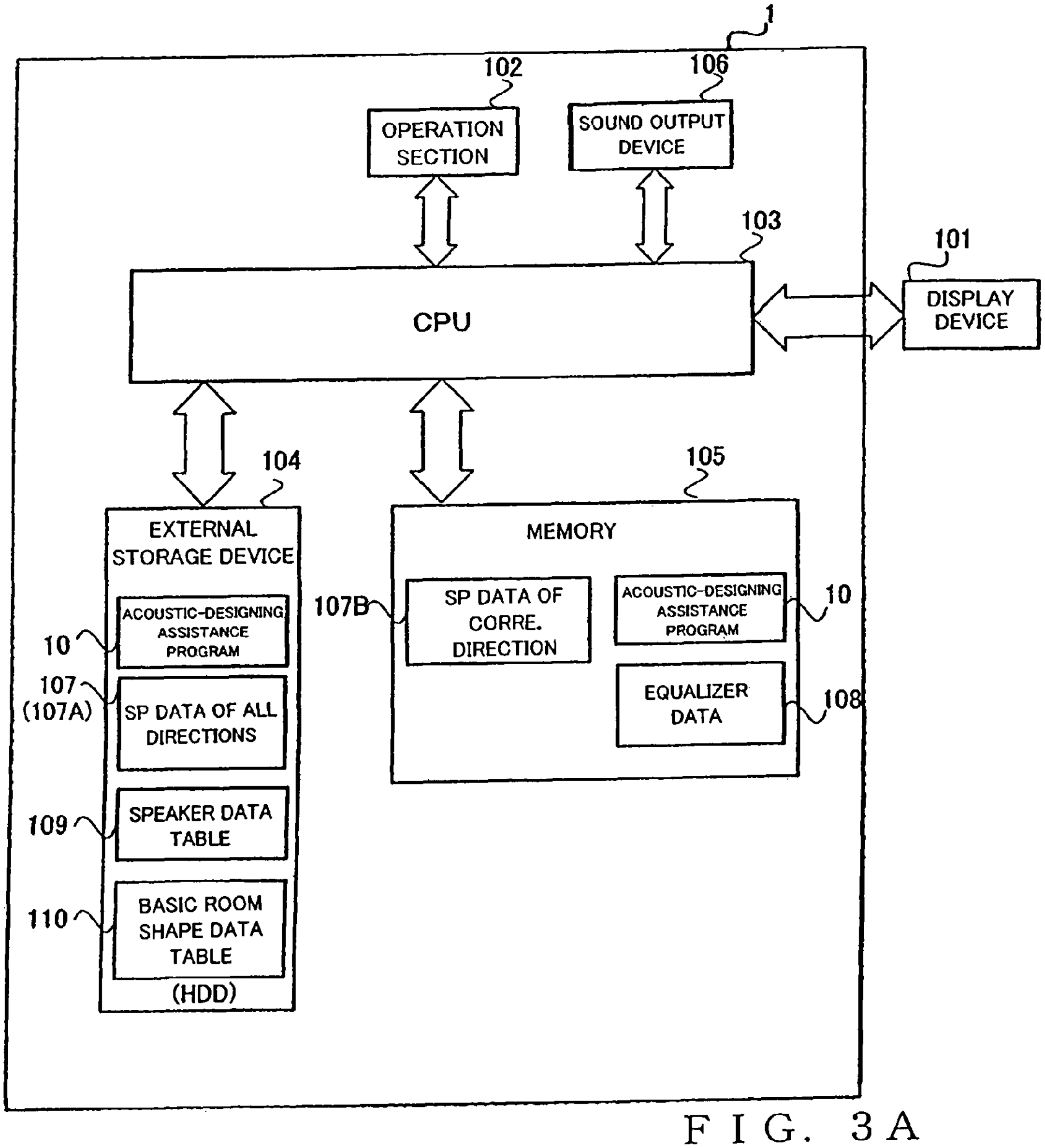
FIG. 3A
| NAME OF ROOM SHAPE | COORDINATE DATA | IMAGE BIT MAP |
|---|---|---|
| FAN SHAPE 1 | $(x, Y, z)_1$ |  |
| FAN SHAPE 2 | $(x, Y, z)_2$ |  |
| ... | ... | ... |
FIG. 3B

SPEAKER DATA TABLE 109

| NAME OF SPEAKER TYPE (109A) | AREA ($m^2$) (109B) | PURPOSE OF USE (109C) | INSTALLING POSITION (109D) | VERTICAL-TO-HORIZONTAL RATIO (109E) | INTER-SPEAKER-UNIT ANGLE (109F) |
|---|---|---|---|---|---|
| SPEAKER A | 300-750 | MUSIC | CENTER | $0.6<(W/L)\leqq 1.5$ | 60-120/5.0° VARIATION PITCH |
| SPEAKER B | 300-750 | MUSIC | CENTER | $1.5<(W/L)$ | 60-120/5.0° VARIATION PITCH |
| SPEAKER C | 400-800 | MUSIC | LEFT & RIGHT | $(W/L)\leqq 1$ | 30-60/2.5° VARIATION PITCH |
| SPEAKER D | 400-800 | MUSIC | CENTER | $(W/L)\leqq 0.6$ | 30-60/2.5° VARIATION PITCH |
| SPEAKER E | $<400$ | MUSIC | LEFT & RIGHT | | - |
| SPEAKER F | 300-750 | MUSIC/SPEECH | CENTER | $0.6<(W/L)\leqq 1.5$ | 30-90/5.0° VARIATION PITCH |
| SPEAKER G | 300-750 | MUSIC/SPEECH | CENTER | $1.5<(W/L)$ | 30-90/5.0° VARIATION PITCH |
| SPEAKER H | $750<$ | MUSIC/SPEECH | CENTER | $0.6<(W/L)\leqq 1.5$ | 30-90/5.0° VARIATION PITCH |
| SPEAKER I | $750<$ | MUSIC/SPEECH | CENTER | $1.5<(W/L)$ | 30-60/2.5° VARIATION PITCH |
| SPEAKER J | 300-750 | MUSIC/SPEECH | CENTER | $(W/L)\leqq 0.6$ | 30-60/2.5° VARIATION PITCH |

F I G. 8

RESPONSE WAVEFORM SYNTHESIS METHOD AND APPARATUS

BACKGROUND OF THE INVENTION

The present invention relates generally to a response waveform synthesis method and apparatus for synthesizing a time-axial impulse response waveform on the basis of acoustic characteristics in the frequency domain, an acoustic-designing assistance apparatus and method using the response waveform synthesis method, and a storage medium storing an acoustic-designing assistance program.

For installation of a speaker system in a hall, event site or other room (or acoustic facility), it has heretofore been conventional for an audio engineer or designer to select a suitable speaker system on the basis of a shape, size, etc. of the room (or acoustic facility) and then design a position and orientation in which the selected speaker system is to be installed and equalizer characteristics, etc. of the speaker system to be installed.

Because the designing work requires skill and cumbersome calculations, there have so far been proposed various acoustic-designing assistance apparatus and programs, for example, in Japanese Patent Application Laid-open Publication Nos. 2002-366162, 2003-16138, HEI-09-149500 and 2005-49688 (which will hereinafter be referred to as patent literatures 1, 2, 3 and 4, respectively). With the acoustic-designing assistance apparatus and programs, it is desirable that acoustic characteristics in a surface (hereinafter referred to as "speaker-sound receiving surface" or "sound receiving surface") where seats or the like are located and which receives sounds from speakers to be installed an acoustic hall or other room (or acoustic facility) be visually displayed in advance on a display device, on the basis of characteristics of a selected speaker system, so that the acoustic characteristics of the selected speaker system can be simulated so as to assist in selection of the speaker system before audio equipment, such as a speaker system, is carried into the room (i.e., actual acoustic space), such as an acoustic hall. Further, it is desirable that, even after installation, in the room, of the selected speaker system, such an acoustic-designing assistance apparatus and program be used to simulate acoustic adjustment states of the system so that the acoustic adjustment states can be reflected in acoustic adjustment of the system.

The aforementioned No. 2002-366162 publication (i.e., patent literature 1) discloses obtaining in advance data of impulse responses of various positions around each speaker and automatically calculating sound image localization parameters of a sound receiving surface on the basis of the obtained impulse response data. According to the disclosure in this literature, templates of the impulse responses are prestored by the impulse responses being subjected to FFT (Fast Fourier Transformation). Patent literature 2 identified above discloses an acoustic-system-designing assistance apparatus which automatizes equipment selection and designing work using a GUI (Graphical User Interface). Patent literature 3 identified above discloses an apparatus which automatically calculates desired sound image localization parameters. Further, Patent literature 4 identified above discloses an acoustic adjustment apparatus which automatically adjusts acoustic frequency characteristics, in a short period of time, using characteristic data of differences between sound signals output from speakers and sound signals picked up by a microphone in an actual site or room.

Moreover, acoustic-designing assistance programs arranged in the following manner are in practical use today. Namely, although their application is limited to a speaker system of a planar or two-dimensional line array type, each of such acoustic-designing assistance programs calculates a necessary number of speakers and orientation, level balance, equalizer (EQ) parameters and delay parameters of each of the speakers for a predetermined sound receiving area of a sound receiving surface, by inputting thereto a sectional shape of an acoustic room, such as a music hall or the like.

With the aforementioned conventionally-known acoustic-designing assistance apparatus, there has been a demand for a function for simulating acoustic characteristics of sounds from speakers when the sounds have been received at a given sound receiving point (e.g., seat) and permitting test-listening of the simulated sounds so as to check in advance what kinds of sounds can be heard at the sound receiving point.

In many of the aforementioned conventionally-known acoustic-designing assistance apparatus, analysis of frequency characteristics is performed by dividing a frequency range of an audible sound into a plurality of partial bands and then performing FFT analyses on the partial frequency bands with the number of sampling points differing among the partial frequency bands, to allow frequency resolution to become finer in order of lowering frequencies of the partial bands. However, if frequency characteristics obtained from the plurality of partial frequency bands are merely added together after being subjected to inverse FFT transformation independently of each other, there would arise discontinuous or discrete points in the frequency characteristics, which tends to cause unwanted noise and unnatural sound.

SUMMARY OF THE INVENTION

In view of the foregoing, it is an object of the present invention to provide an improved response waveform synthesis method and apparatus capable of obtaining a non-discontinuous waveform on the basis of frequency characteristics obtained from a plurality of divided partial frequency bands. It is another object of the present invention to provide a storage medium containing a program for causing a computer to perform the response waveform synthesis method, as well as an acoustic-designing assistance technique using the response waveform synthesis method.

In order to accomplish the above-mentioned objects, the present invention provides an improved response waveform synthesis method, which comprises: an inverse FFT step of using frequency characteristics, determined for individual ones of a plurality of analyzed bands divided from a predetermined audio frequency range, to set a synthesized band for each one or for each plurality of the analyzed bands and then determining a time-axial response waveform for each of the synthesized bands, the frequency characteristics being determined, for the individual analyzed bands, with frequency resolution that becomes finer in order of lowering frequencies of the analyzed bands; and an additive synthesis step of adding together the response waveforms of the synthesized bands, to thereby provide a response waveform for a whole of the audio frequency range.

According to the present invention, a synthesized band is set for each one or plurality of the analyzed bands without the frequency characteristic determined for each of the analyzed bands being used directly as-is, and a time-axial waveform is determined for each of the synthesized bands. Thus, the present invention can synthesize a smooth response waveform and thereby determine a non-discontinuous waveform on the basis of the frequency characteristics obtained by dividing the audio frequency bands into the plurality of partial (analyzed) bands.

Preferably, the inverse FFT step uses the frequency characteristics, determined for the individual analyzed bands (0-n) divided from the audio frequency range, to determine the time-axial response waveform for each of the synthesized bands i (i=1, 2, . . . , n) having a frequency band of the (i−1)-th analyzed band and a frequency band of the i-th analyzed band, and the additive synthesis step adds together the response waveforms of the synthesized bands i (i=1, 2, . . . , n) determined by the inverse FFT step, to thereby provide the response waveform for the whole of the audio frequency range. Thus, by using a same analyzed band i for adjoining i-th and (i+1)-th synthesized bands in an overlapping manner, the present invention can synthesize a smooth response waveform, without involving discrete characteristics in boundary regions between the bands even when the response waveform is determined per band.

Preferably, the inverse FFT step determines the response waveform for each of the synthesized bands i (i=1, 2, 3, . . . , n), using a frequency characteristic value obtained by multiplying a portion of the synthesized band, corresponding to the (i−1)-th analyzed band, by a sine square function ($\sin^2\theta$) as a rise portion of the waveform and a frequency characteristic value obtained by multiplying a portion of the synthesized band, corresponding to the i-th analyzed band, by a cosine square function ($\cos^2\theta$) as a fall portion of the waveform. Because $\sin^2\theta+\cos^2\theta=1$, even when the same analyzed band i is used for the adjoining i-th and (i+1)-th synthesized bands in an overlapping manner, the present invention can accurately reproduce frequency characteristics of the original analyzed band by additively synthesizing the response waveforms of the individual synthesized bands.

According to another aspect of the present invention, there is provided an improved response waveform synthesis apparatus, which comprises: a frequency characteristic storage section storing frequency characteristics determined for individual ones of a plurality of analyzed bands divided from a predetermined audio frequency range, the frequency characteristics being determined with frequency resolution that becomes finer in order of lowering frequencies of the analyzed bands; an inverse FFT operation section that sets a synthesized band for each one or for each plurality of the analyzed bands and then determines a time-axial response waveform for each of the synthesized bands; and an additive synthesis section that adds together the response waveforms of the synthesized bands, to thereby provide a response waveform for a whole of the audio frequency range.

Preferably, the response waveform synthesis apparatus further comprises: a characteristic storage section storing respective characteristics of a plurality of types of speakers; a speaker selection assistance section that selects selectable speaker candidates on the basis of information of a shape of a room where speakers are to be positioned; a speaker selection section that receives selection operation for selecting one speaker from among the selectable speaker candidates; a speaker installation angle optimization section that, on the basis of a characteristic of the speaker selected via the speaker selection section, determines such an installing orientation of the speaker as to minimize variation in sound level at individual positions of a sound receiving surface of the room; and a frequency characteristic calculation section that calculates, for each of the plurality of analyzed bands divided from the audio frequency range, a frequency characteristic at a predetermined position of the room on the basis of the information of the shape of the room and the installing orientation of the speaker determined by the speaker installation angle optimization section. Here, the frequency characteristic storage section stores the frequency characteristic calculated by the frequency characteristic calculation section for each of the analyzed bands. Such arrangements can simulate sounds produced through a designed speaker arrangement. As a result, it is possible to implement an improved acoustic-designing assistance apparatus or method, by applying the response waveform synthesis technique of the present invention.

Preferably, the response waveform synthesis apparatus further comprises a sound signal processing section including a filter having set therein a characteristic of the response waveform for the whole of the audio frequency range provided by the additive synthesis section. Here, a desired sound signal is inputted to the sound signal processing section so that the inputted sound signal is processed by the filter and then the processed sound signal is outputted from the sound processing section. Such arrangements permit test-listening of sounds in simulating sounds with a designed speaker arrangement.

The present invention may be constructed and implemented not only as the method invention as discussed above but also as an apparatus invention. Also, the present invention may be arranged and implemented as a software program for execution by a processor such as a computer or DSP, as well as a storage medium storing such a software program. Further, the processor used in the present invention may comprise a dedicated processor with dedicated logic built in hardware, not to mention a computer or other general-purpose type processor capable of running a desired software program.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

For better understanding of the objects and other features of the present invention, its preferred embodiments will be described hereinbelow in greater detail with reference to the accompanying drawings, in which:

FIG. 3A is a block diagram showing an example inner setup of an acoustic-designing assistance apparatus in accordance with an embodiment of the present invention;

FIG. 3B is a diagram showing a data structure of basic room shape data;

FIG. 8 is a diagram showing a data structure of a speaker data table;

DETAILED DESCRIPTION OF THE INVENTION

Figure 1:
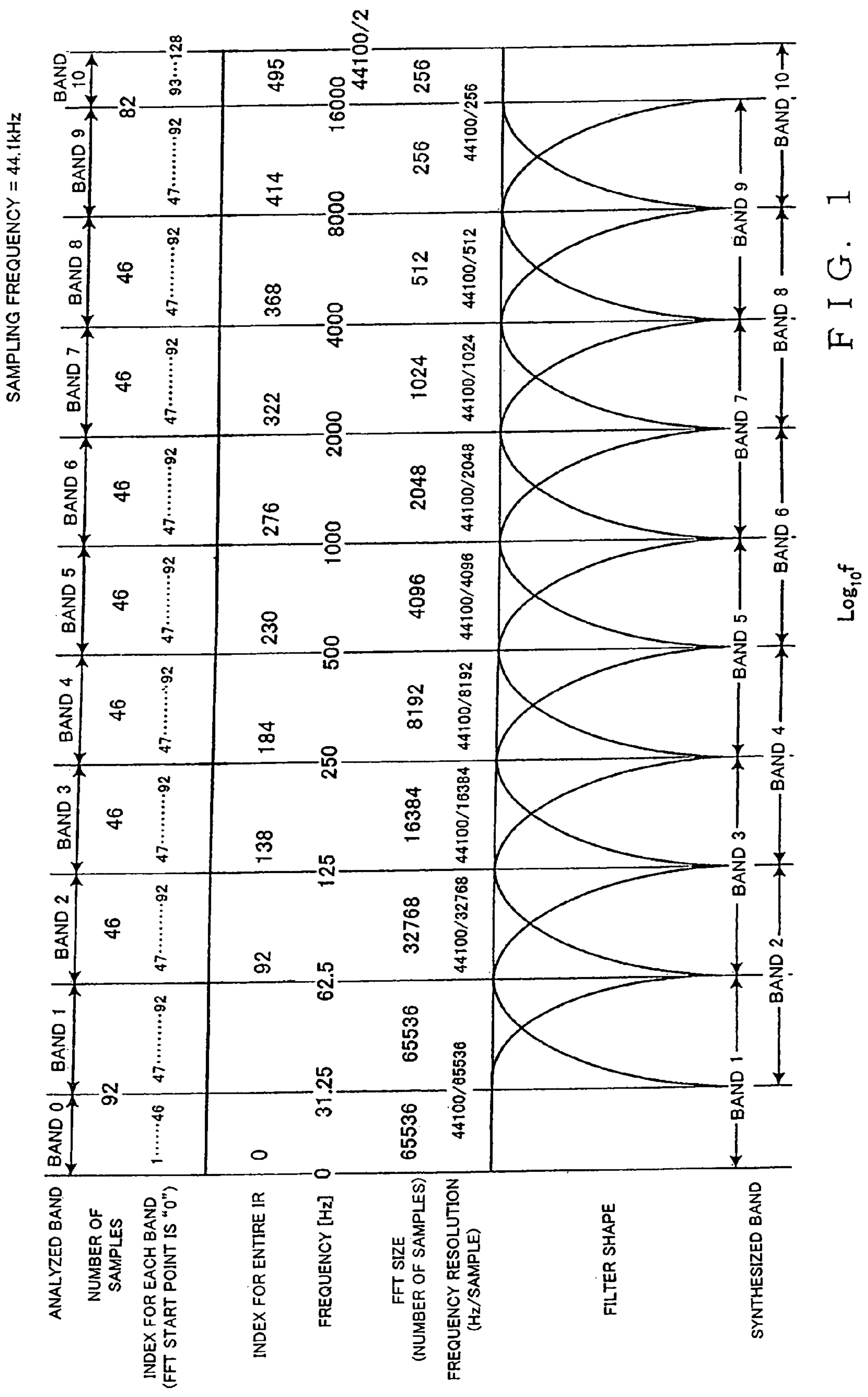
FIG. 1 is a diagram explanatory of a response waveform synthesis method in accordance with an embodiment of the present invention, which particularly outlines Analyzed Bands, Synthesized Bands and window functions.

First, a description will be given about a response waveform synthesis method in accordance with an embodiment of the present invention. FIG. 1 is a diagram explanatory of the response waveform synthesis method which generally comprises dividing a predetermined audio frequency range (e.g., 0 Hz-22050 Hz) into a plurality of partial frequency bands (hereinafter referred to as "analyzed bands") and then synthesizing a time-domain impulse response waveform of the entire audio frequency range on the basis of given frequency characteristics determined for each of the analyzed bands. In the illustrated example of FIG. 1, it is assumed that the sampling frequency of an audio signal processing system in question is 44.1 kHz and thus the upper limit of the audio frequency range is half of the 44.1 kHz sampling frequency, i.e. 22050 Hz. Therefore, if the sampling frequency of the audio signal processing system varies, the predetermined audio frequency range too varies.

In this case, the audio frequency range of 0 Hz-22050 Hz are divided into nine analyzed bands, on an octave-by-octave basis, with 1000 Hz used as a standard unit for the octave-by-octave division, and the lowest and highest analyzed bands, i.e. Analyzed Band 0 and Analyzed Band 10, are each a frequency band less than an octave (such a less-than-octave frequency band will hereinafter be referred to as "fractional frequency band"). Thus, strictly speaking, the audio frequency range of 0 Hz-22050 Hz are divided into a total of eleven analyzed bands from Analyzed Band 0 and Analyzed Band 10, as shown in "Table 1".

TABLE 1

| Band Name AB(n) | Lower-end Frequency FL(n)(Hz) | Upper-end Frequency FH(n)(Hz) | FFT Size FS(n)(Point) | Frequency Resolution FA(n)(Hz/Point) |
|---|---|---|---|---|
| Analyzed Band 0 | 0 | 31.25 | 65536 | 0.672912598 |
| Analyzed Band 1 | 31.25 | 62.5 | 65536 | 0.672912598 |
| Analyzed Band 2 | 62.5 | 125 | 32768 | 1.345825195 |
| Analyzed Band 3 | 125 | 250 | 16384 | 2.691650391 |
| Analyzed Band 4 | 250 | 500 | 8192 | 5.383300781 |
| Analyzed Band 5 | 500 | 1000 | 4096 | 10.76660156 |
| Analyzed Band 6 | 1000 | 2000 | 2048 | 21.53320313 |
| Analyzed Band 7 | 2000 | 4000 | 1024 | 43.06640625 |
| Analyzed Band 8 | 4000 | 8000 | 512 | 86.1328125 |
| Analyzed Band 9 | 8000 | 16000 | 256 | 172.265625 |
| Analyzed Band 10 | 16000 | 22050 | 256 | 172.265625 |

Boundary frequencies between the aforementioned analyzed bands are in octave relationship of 31.25 Hz, 62.5 Hz, 125 Hz, 250 Hz, 500 Hz, 1000 Hz, 2000 Hz, 4000 Hz, 8000 Hz, and 16000 Hz, and the "FFT size" increases in order of lowering frequencies of the analyzed bands. Here, the "FFT size" refers to the number of time-domain sample data to be used in FFT analysis.

More specifically, in the illustrated example of FIG. 1, settings are made such that the FFT size doubles as the frequency decreases by one octave. As indicated in Table 1 above, the FFT size of Analyzed Band 9 (8000-16000 Hz) is 256 samples, and the FFT size of Analyzed Band 8 (4000-8000 Hz) is 512 samples, i.e. twice as great as 256 samples. Then, as the succeeding analyzed bands sequentially lower in octave, the FFT sizes sequentially double to 1024 Hz, 2048 Hz, 4096 Hz, . . . . The FFT size of Analyzed Band 1, having the lowest octave width, is 65536 samples.

With such arrangements, frequency characteristics of the lower frequency bands can be analyzed with finer frequency resolution, while frequency characteristics of the higher frequency bands can be analyzed with roughness commensurate with the frequencies. Note that Analyzed Band 0 (0 Hz-31.25 Hz), i.e. fractional frequency band lower in frequency than Analyzed Band 1, has the same FFT size as Analyzed Band 1. Similarly, Analyzed Band 10, i.e. fractional frequency band higher in frequency than Analyzed Band 9, has the same FFT size as Analyzed Band 9.

Now, with reference to FIG. 1 and Table 2, a description will be given about a procedure for synthesizing an impulse response waveform on the basis of frequency characteristics obtained from the divided analyzed bands. Frequency characteristics of the plurality of analyzed bands, on the basis of which the impulse waveform synthesis according to the instant embodiment of the invention is to be performed, (i.e. frequency characteristics determined, for the individual analyzed bands divided from the audio frequency band, with frequency resolution becoming higher or finer in the order of lowering frequencies of the analyzed bands) may be those obtained in advance in accordance with any of the above-discussed prior art techniques. For example, because the technique of prestoring, as templates, impulse responses having been subjected to FFT transformation processing is known from patent literature 1 (i.e., Japanese Patent Application No. 2002-366162), frequency characteristics of a plurality of analyzed bands, prestored as templates, may be used for the impulse waveform synthesis according to the instant embodiment of the invention. Alternatively, frequency characteristics created appropriately by the user itself may be used for the impulse waveform synthesis according to the instant embodiment.

According to the instant embodiment, the impulse response waveform is synthesized by combining the frequency characteristics of every adjoining two of the aforementioned eleven analyzed bands to create frequency characteristics of ten synthesized bands and then performing inverse FFT transformation on the frequency characteristics of each of the synthesized bands. Each of the synthesized bands overlaps with upper and lower synthesized bands immediately adjoining the same; these synthesized bands are interconnected in a crossfade fashion (i.e., crossfade-connected) by multiplying values of the frequency characteristics of one of the adjoining synthesized bands by a window function of $\sin^2\theta$ and multiplying values of the frequency characteristics of the other of the adjoining synthesized bands by a window function of $\cos^2\theta$. Because $\sin^2\theta+\cos^2\theta=1$, it is possible to synthesize a smooth impulse response waveform, having original frequency characteristics reproduced therein, by additively synthesizing time-axial impulse response waveforms calculated by performing inverse FFT transformation on the frequency characteristics of the individual synthesized bands.

TABLE 2

| Band No. | Lower-end Frequency(Hz) | Upper-end Frequency(Hz) | Number of Sample Points | Lower-side Frequency (Hz) | Upper-side Frequency (Hz) |
|---|---|---|---|---|---|
| Synthesized Band 1 | 0 | 62.5 | 65536 | Flat Portion 0-31.5 | Fall Portion 31.5-62.5 |
| Synthesized Band 2 | 31.25 | 125 | 32768 | Rise Portion 31.5-62.5 | Fall Portion 62.5-125 |
| Synthesized Band 3 | 62.5 | 250 | 16384 | Rise Portion 62.5-125 | Fall Portion 125-250 |
| Synthesized Band 4 | 125 | 500 | 8192 | Rise Portion 125-250 | Fall Portion 250-500 |
| Synthesized Band 5 | 250 | 1000 | 4096 | Rise Portion 250-500 | Fall Portion 500-1000 |
| Synthesized Band 6 | 500 | 2000 | 2048 | Rise Portion 500-1000 | Fall Portion 1000-2000 |
| Synthesized Band 7 | 1000 | 4000 | 1024 | Rise Portion 1000-2000 | Fall Portion 2000-4000 |
| Synthesized Band 8 | 2000 | 8000 | 512 | Rise Portion 2000-4000 | Fall Portion 4000-8000 |
| Synthesized Band 9 | 4000 | 16000 | 256 | Rise Portion 4000-8000 | Fall Portion 8000-16000 |
| Synthesized Band 10 | 8000 | 22050 | 256 | Rise Portion 8000-16000 | Flat Portion 16000-22050 |

The individual synthesized bands have frequency bands as shown in FIG. 1 and Table 2. Synthesized Band 1 and Synthesized Band 2 overlap with each other over a region of 31.25 Hz-62.5 Hz. Both of real and imaginary parts of the frequency characteristics of the "31.25 Hz-62.5 Hz" overlapping region located in a rear half of Synthesized Band 1 are multiplied by the window function of $\cos^2\theta$ and imparted with an envelope of a fall portion. On the other hand, both of real and imaginary parts of the frequency characteristics of the "31.25 Hz-62.5 Hz" overlapping region located in a front half of Synthesized Band 2, corresponding to the rear half of Synthesized Band 1, are multiplied by the window function of $\sin^2\theta$ and imparted with an envelope of a rise portion. "0 Hz-31.25 Hz" region of Synthesized Band 1 is a flat portion, and results of FFT transformation using 6553 sample data are used directly as the flat portion.

Because inverse FFT transformation comprises arithmetic operations on discrete values, inverse FFT transformation is performed, in Synthesized Band 1 and Synthesized Band 2, using the following frequency-axial discrete value sample data. Further, because the analyzed bands and synthesized bands are set at equal intervals on the common logarithmic axis as shown in FIG. 1, the window functions too are set to provide waveforms of sine and cosine squares, respectively, on the logarithmic axis.

[Synthesized Band 1]

(1) Flat portion ranges from 0 Hz to 31.25 Hz, FFT size is 65536, sample numbers j of Analyzed Band 0=1, 2, . . . , 45, 46, and sample interval is about 0.67 Hz. Values of the sample data in question are used as-is.

(2) Fall portion ranges from 31.25 Hz to 62.5 Hz, FFT size is 65536, sample numbers j of Analyzed Band 1=47, 48, . . . , 91, 92, and sample interval is about 0.67 Hz.

$$\mathrm{Real}[j]=\mathrm{Real}[j]*\cos^2(\theta)$$

$$Img[j]=Img[j]*\cos^2(\theta)$$

$$\theta=PAI/2*[\{\log 10*\Delta\mathrm{Freq}[1])-\log 10(31.25)\}/\{\log 10(62.5)-\log 10(31.25)\}],$$

where PAI is the circular constant π.

$$\Delta\mathrm{Freq}[1]=44100/65536$$

Namely, in the front half (i.e., lower-side frequency zone) of Synthesized Band 1, 46 sample data are acquired by sampling, at intervals of about 0.67 Hz, the frequency characteristics of Synthesized Band 0 ranging from 0 Hz to 31.25 Hz, and the envelope is left flat. For convenience, 1, 2, . . . , 46 are assigned, as sample numbers j, to the thus-acquired 46 sample data. In the rear half (i.e., upper-side frequency zone) of Synthesized Band 1, 46 sample data are acquired by sampling the frequency characteristics of Synthesized Band 1 ranging from 31.25 Hz to 62.5 Hz, and an envelope of a fall portion is imparted to these sample data. For convenience, 47, 48, . . . , 92 are assigned, as sample numbers j, to the thus-acquired 46 sample data of the rear half (i.e., upper-side frequency zone). The rear half (i.e., upper-side frequency zone) of Synthesized Band 1 is a frequency zone overlapping with the front half (lower-side frequency zone) of next Synthesized Band 2.

[Synthesized Band 2]

(1) Rise portion ranges from 31.25 Hz to 62.5 Hz, FFT size is 65536, and sample numbers j of Analyzed Band 1=48, 50, . . . , 90, 92 (every second sample of the 46 sample data used in Synthesized Band 1 is used so that a total of 23 sample data are used here; thus, the sample interval is set at about 1.34 Hz).

$$Real[j]=Real[j]*\sin^2(\theta)$$

$$Img[j]=Img[j]*sin^2(\theta)$$

$$\theta=PAI/2*[\{\log 10(j*\Delta Freq[1])-\log 10(31.25)\}/\{\log 10(62.5)-\log 10(31.25)\}]$$

$$\Delta Freq[1]=44100/65536$$

(2) Fall portion ranges from 62.5 Hz to 125 Hz, FFT size is 32768, sample numbers j Analyzed Band 2=47, 48, . . . , 91, 92, and sample interval is about 1.34 Hz.

Because the sample interval (frequency) of Synthesized Band 2 is double that of Synthesized Band 1, a waveform obtained by the inverse FFT transformation has a frequency that is double that of Synthesized Band 1 even if sample data of the same sample numbers as the sample data used in Synthesized Band 1 are used here.

$$Real[b]=Real[b]*\cos^2(\theta)$$

$$Img[j]=Img[j]*cos^2(\theta)$$

$$\theta=PAI/2*[\{\log 10(j*\Delta Freq[2])-\log 10(62.5)\}/\{\log 10(125)-\log 10(62.5)\}]$$

$$\Delta Freq[2]=44100/32768$$

Namely, in the front half (i.e., lower-side frequency zone) of Synthesized Band 2, 23 sample data are acquired by sampling, at intervals of about 1.34 Hz, the frequency characteristics of Synthesized Band 1 ranging from 31.25 Hz to 62.5 Hz, and an envelope of a rise portion is imparted to the thus-acquired sample data. If, for convenience, the same numbers as used in Synthesized Band 1 are used as sample numbers j, these sample data are assigned even sample numbers 48, 50, . . . 90, 92. In the rear half (i.e., upper-side frequency zone) of Synthesized Band 2, 46 sample data are acquired by sampling the frequency characteristics of Synthesized Band 2 ranging from 62.5 Hz to 125 Hz, and an envelope of a fall portion is imparted to these sample data. Further, for convenience, 47, 48, . . . , 92 are assigned, as sample numbers j, to the thus-acquired 46 sample data. The rear half (i.e., upper-side frequency zone) of Synthesized Band 2 is a frequency zone overlapping with the front half (lower-side frequency zone) of next Synthesized Band 3.

In a similar manner to Synthesized Band 2 described above, the front half (lower-side frequency zone) and rear half (upper-side frequency zone) of each of Synthesized Band 3-Synthesized Band 9 is set to the same sample interval (frequency), by acquiring 23 sample data from frequency characteristics of the synthesized band to be used as the front half (lower-side frequency zone) and acquiring 46 sample data from frequency characteristics of the synthesized band to be used as the rear half (upper-side frequency zone). Then, an envelope of a rise portion is imparted to the sample data of the front half (lower-side frequency zone), while an envelope of a fall portion is imparted to the sample data of the rear half (upper-side frequency zone). However, the FFT size, sample interval (frequency), θ calculation, etc. differ among the bands. The following paragraphs discuss only differences among the bands.

[Synthesized Band 3]

The sample interval is 2.69 Hz.

(1) Rise portion ranges from 62.5 Hz-125 Hz. The FFT size is 32768, but every second sample is used.

$$\theta=PAI/2*[\{\log 10(j*\Delta Freq[2])-\log 10(62.5)\}/\{\log 10(125)-\log 10(62.5)\}]$$

$$\Delta Freq[2]=44100/32768$$

(2) Fall portion ranges from 125 Hz-250 Hz. The FFT size is 16384.

$$\theta=PAI/2*[\{\log 10(j*\Delta Freq[3])-\log 10(125)\}/\{\log 10(250)-\log 10(125)\}]$$

$$\Delta Freq[3]=44100/16384$$

[Synthesized Band 4]

The sample interval is 5.38 Hz.

(1) Rise portion ranges from 125 Hz-250 Hz. The FFT size is 16384, but every second sample is used.

$$\theta=PAI/2*[\{\log 10(j*\Delta Freq[3])-\log 10(125)\}/\{\log 10(250)-\log 10(125)\}]$$

$$\Delta Freq[3]=44100/16384$$

(2) Fall portion ranges from 250 Hz-500 Hz. The FFT size is 8192.

$$\theta=PAI/2*[\{\log 10(j*\Delta Freq[4])-\log 10(250)\}/\{\log 10(500)-\log 10(250)\}]$$

$$\Delta Freq[4]=44100/8192$$

[Synthesized Band 5]

The sample interval is 10.76 Hz.

(1) Rise portion ranges from 250 Hz-500 Hz. The FFT size is 8192, but every second sample is used.

$$\theta=PAI/2*[\{\log 10(j*\Delta Freq[4])-\log 10(250)\}/\{\log 10(500)-\log 10(250)\}]$$

$$\Delta Freq[4]=44100/8192$$

(2) Fall portion ranges from 500 Hz-1000 Hz. The FFT size is 4096.

$$\theta=PAI/2*[\{\log 10(j*\Delta Freq[5])-\log 10(500)\}/\{\log 10(1000)-\log 10(500)\}]$$

$$\Delta Freq[5]=44100/4096$$

[Synthesized Band 6]

The sample interval is 21.53 Hz.

(1) Rise portion ranges from 500 Hz-1000 Hz. The FFT size is 4096, but every second sample is used.

$$\theta=PAI/2*[\{\log 10(j*\Delta Freq[5])-\log 10(500)\}/\{\log 10(1000)-\log 10(500)\}]$$

$$\Delta Freq[5]=44100/4096$$

(2) Fall portion ranges from 1000 Hz-2000 Hz. The FFT size is 2048.

$$\theta=PAI/2*[\{\log 10(j*\Delta Freq[6])-\log 10(1000)\}/\{\log 10(2000)-\log 10(1000)\}]$$

$$\Delta Freq[6]=44100/2048$$

[Synthesized Band 7]

The sample interval is 43.07 Hz.

(1) Rise portion ranges from 1000 Hz-2000 Hz. The FFT size is 2048, but every second sample is used.

$$\theta = PAI/2*[\{\log 10(j*\Delta Freq[6]) - \log 10(1000)\}/\{\log 10(2000) - \log 10(1000)\}]$$

$$\Delta Freq[6] = 44100/2048$$

(2) Fall portion ranges from 2000 Hz-4000 Hz. The FFT size is 1024.

$$\theta = PAI/2*[\{\log 10(j*\Delta Freq[7]) - \log 10(2000)\}/\{\log 10(4000) - \log 10(2000)\}]$$

$$\Delta Freq[7] = 44100/1024$$

[Synthesized Band 8]

The sample interval is 86.13 Hz.

(1) Rise portion ranges from 2000 Hz-4000 Hz. The FFT size is 1024, but every second sample is used.

$$\theta = PAI/2*[\{\log 10(j*\Delta Freq[7]) - \log 10(2000)\}/\{\log 10(4000) - \log 10(2000)\}]$$

$$\Delta Freq[7] = 44100/1024$$

(2) Fall portion ranges from 4000 Hz-8000 Hz. The FFT size is 512.

$$\theta = PAI/2*[\{\log 10(j*\Delta Freq[8]) - \log 10(4000)\}/\{\log 10(8000) - \log 10(4000)\}]$$

$$\Delta Freq[8] = 44100/512$$

[Synthesized Band 9]

The sample interval is 172.27 Hz.

(1) Rise portion ranges from 4000 Hz-8000 Hz. The FFT size is 512, but every second sample is used.

$$\theta = PAI/2*[\{\log 10(j*\Delta Freq[8]) - \log 10(4000)\}/\{\log 10(8000) - \log 10(4000)\}]$$

$$\Delta Freq[8] = 44100/512$$

(2) Fall portion ranges from 8000 Hz-16000 Hz. The FFT size is 256.

$$\theta = PAI/2*[\{\log 10(j*\Delta Freq[9]) - \log 10(8000)\}/\{\log 10(16000) - \log 10(8000)\}]$$

$$\Delta Freq[9] = 44100/256$$

In next Synthesized Band 10, highest in frequency, there is no overlapping zone in its upper side, and thus, the upper half constitutes a flat portion.

[Synthesized Band 10]

The sample interval is 172.27 Hz. The FFT size is 256.

(1) Rise portion ranges from 8000 Hz-16000 Hz, and sample numbers j of Analyzed Band 9=48, 49, 50, . . . , 90, 91, 92 are used.

$$Real[b] = Real[j]*\sin^2(\theta)$$

$$Imaginary[j] = Imaginary[j]*\sin^2(\theta)$$

$$\theta = PAI/2*[\{\log 10(j*\Delta Freq[9]) - \log 10(8000)\}/\{\log 10(16000) - \log 10(8000)\}]$$

$$\Delta Freq[9] = 44100/256$$

(2) Flat portion ranges from 16000 Hz to 22050 Hz, FFT size is 256, sample numbers j=93, 94, . . . , 128, 129. The values are used as-is.

In the instant embodiment, inverse FFT arithmetic operations are performed on each of the aforementioned ten synthesized bands on the basis of the individual sample data (along the frequency axis) of the frequency characteristics, to thereby obtain time-axial frequency response waveforms of the individual synthesized bands, and then these frequency response waveforms of the synthesized bands are additively synthesized to obtain an impulse response waveform of the entire audio frequency range.

Figure 2:
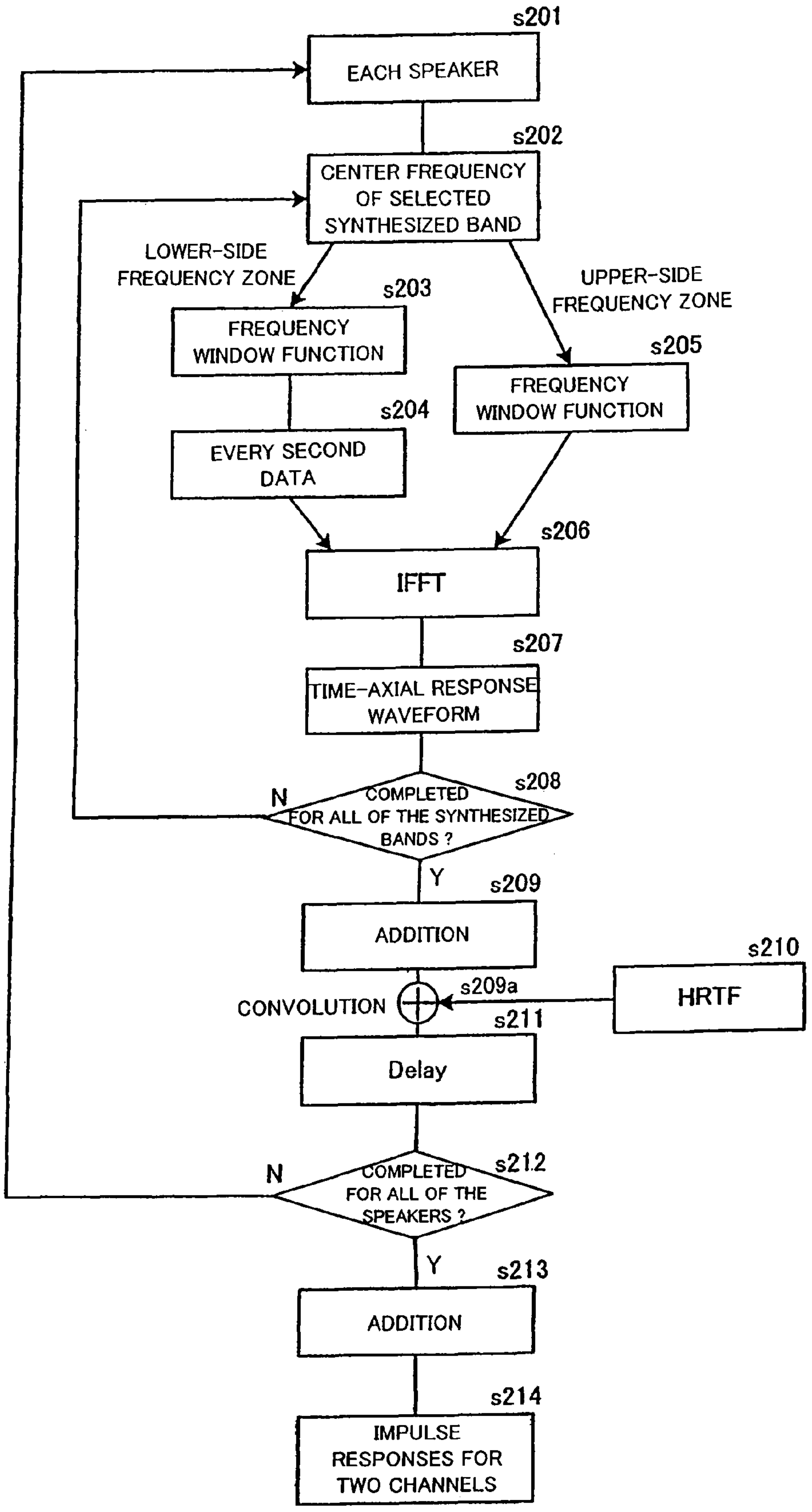
FIG. 2 is a flow chart showing an example operational sequence for synthesizing impulse response waveforms.

FIG. 2 is a flow chart showing an example operational sequence for obtaining impulse response waveforms of the individual synthesized bands, using the aforementioned frequency characteristics of the corresponding analyzed bands, and obtaining an impulse response waveform for the whole of the audio frequency range. The flow chart of FIG. 2 represents processing for determining what kind of response characteristics sounds output from individual speaker units, constituting a speaker array, present at a particular sound receiving point.

First, characteristics of one of the plurality of speaker units are read out at step s201. Such characteristics are determined in advance, for each of the analyzed bands, by convoluting characteristics of an equalizer into frequency characteristics, obtained with respect to a direction toward the sound receiving point, of the speaker unit installed in a predetermined orientation.

First, any one of Synthesized Band 1-Synthesized Band 10 is selected, and the center frequency of the selected synthesized band (i.e., frequency at the border between two adjoining analyzed bands corresponding to the selected synthesized band) is identified, at step s202. Then, the lower-side frequency zone (rise portion) lower than the identified center frequency (31.25 Hz, 62.5 Hz, 125 Hz, . . . or 16000 Hz), except that of Analyzed Band 0, is multiplied by the window function of $\sin^2\theta$ (step s203), and every second data of the multiplied lower-side frequency zone is selected (s204). On the other hand, the upper-side frequency zone (fall portion) higher than the identified center frequency, except that of Analyzed Band 10, is multiplied by the window function of $\cos^2\theta$ (step s205).

Then, inverse FFT arithmetic operations are performed on the basis of the thus-acquired data of the synthesized band (s206), to thereby obtain a time-axial impulse response waveform of the band.

Determination is made, at step s208, as to whether the operations of steps s202-s207 have been completed for all of the synthesized bands. The operations of steps s202-s207 are repeated until a YES determination is made at step s208. Once a YES determination is made at step s208, the impulse response waveforms obtained for all of the synthesized bands are additively synthesized to obtain an impulse response waveform of the entire audio frequency range (step s209). Then, a head-related transfer function is convoluted into the impulse response waveform of the entire audio frequency range (steps s209*a* and s210). Then, a delay based on a distance between the speaker and the sound receiving point is imparted to the impulse response waveform (step s211), to thereby provide impulse responses of two, i.e. left and right, channels for a sound field from the speaker unit to a sound-listening person located at the sound receiving point.

Determination is made, at step s212, as to whether the operations of steps s201-s211 have been completed for all of the speaker units. The operations of steps s201-s211 are repeated until a YES determination is made at step s212. Once a YES determination is made at step s212, the impulse responses determined for all of the speakers are added together (step s213), to thereby provide impulse responses of two, i.e. left and right, channels in the sound field from the speaker array to the sound-listening person.

The acoustic-designing assistance apparatus of the invention constitutes a sound field simulator using the thus-determined impulse responses as filter coefficients. Namely, the acoustic-designing assistance apparatus of the invention constitutes a filter using the impulse responses as filter coefficients, which performs filter processing a musical sound or tone (dry source) and outputs the processed tone to headphones. Thus, any human designer can know in advance what kind of sound is output with a designed speaker system, through test-listening of the sound.

Now, a description will be given about the acoustic-designing assistance apparatus to which is applied the above-described response waveform synthesis method. This acoustic-designing assistance apparatus 1 is intended to assist designing, such as selection and setting of devices in a case where a speaker system (sound reinforcing system) is to be installed in a room (or venue or acoustic facility), such as a music hall or conference hall. The acoustic-designing assistance apparatus 1 has functions for simulating a sound field formed within the room when a sound is output within the room using the designed speaker system, visually displaying results of the simulation on a display and audibly outputting the simulation results through headphones.

FIG. 3A is a block diagram showing an example general setup of the acoustic-designing assistance apparatus. As shown, the acoustic-designing assistance apparatus 1 includes a display 105, an operation section 102, a CPU 103, an external storage device 104 like a hard disk (HDD), a memory 105, and a sound output section 106. To the CPU 103 are connected the operation section 102, hard disk (HDD) 104, memory 105 and sound output device 106.

Figure 5:
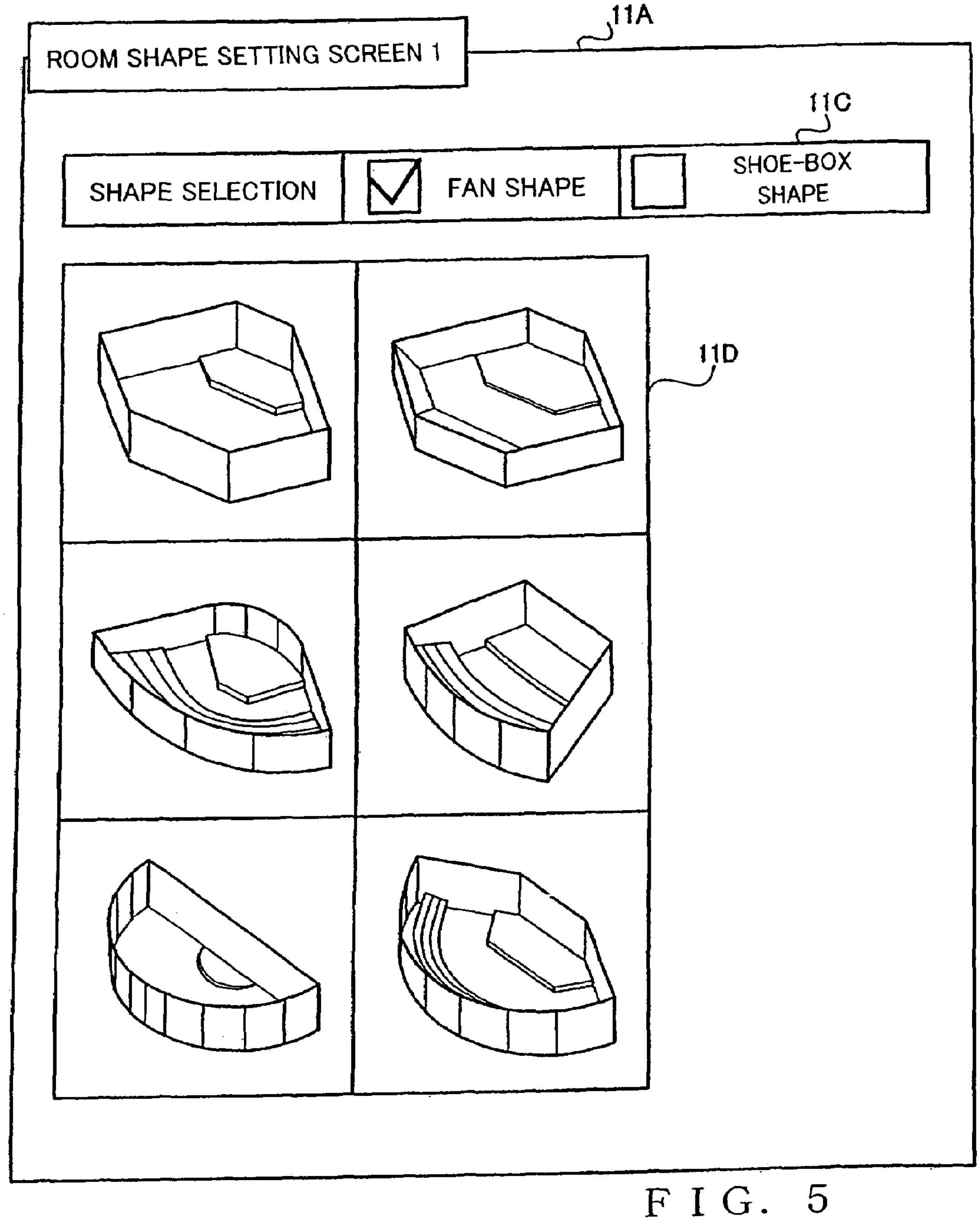
FIG. 5 is a diagram showing an example GUI for setting a general shape of a room where speakers are to be positioned.
Figure 6:
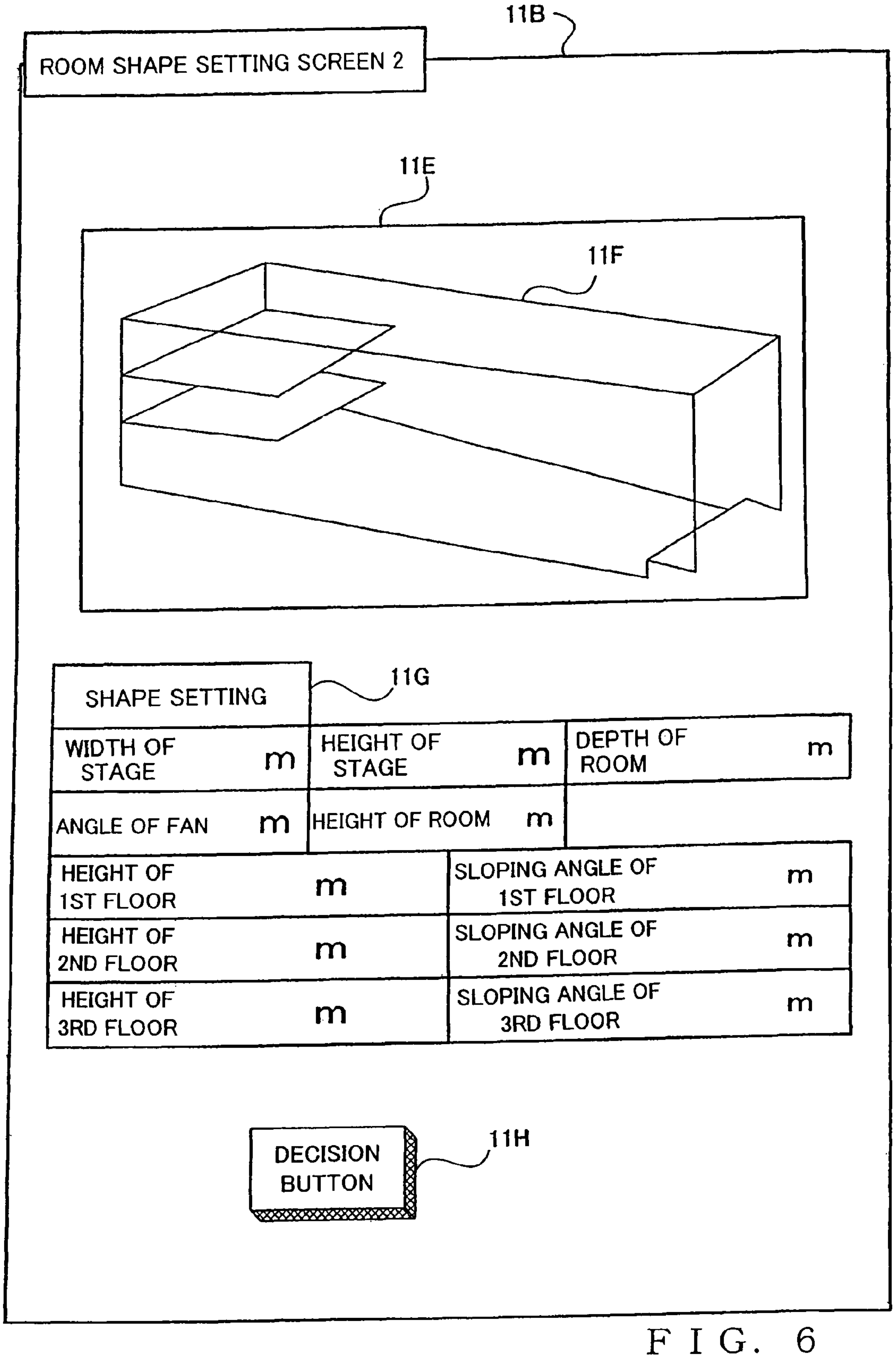
FIG. 6 is a diagram showing an example GUI for inputting shape parameters to set a general shape of a room where speakers are to be positioned.
Figure 7:
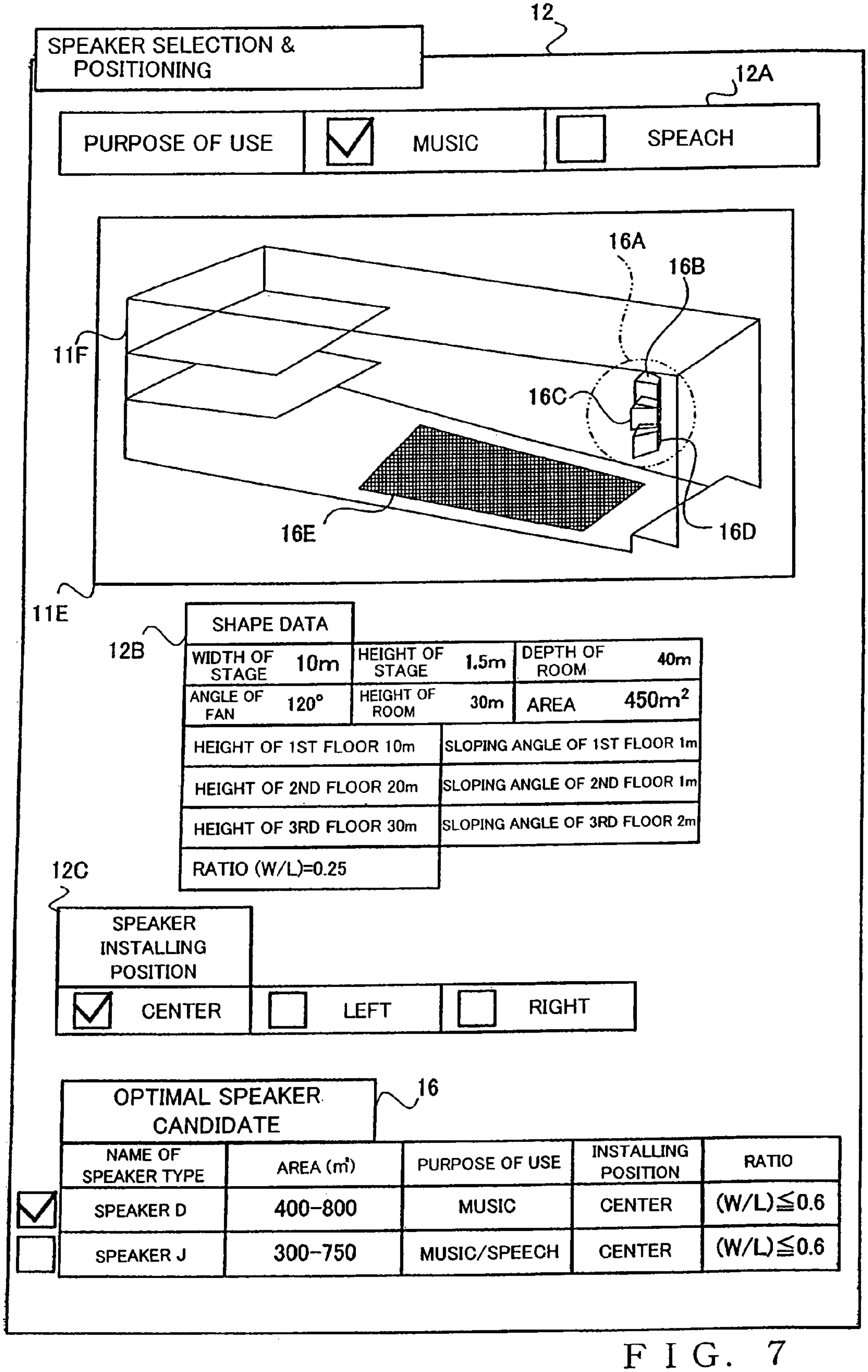
FIG. 7 is a diagram showing an example GUI for making visual displays for selection and positioning of a speaker.

The display device 101 is, for example, in the form of a general-purpose liquid crystal display, which displays screens for assisting entry of various setting conditions (see FIGS. 5-7).

The operation section 102 receives inputs of various setting conditions, input instructing simulation of a sound field, input instructing optimization of speaker layout, and selection of a display style of simulation results.

The CPU 103 executes programs stored in the HDD 104. In response to an instruction given via the operation section 102, the CPU 103 executes a corresponding one of the programs in conjunction with another hardware resource of the acoustic-designing assistance apparatus 1.

The HDD 104 has stored therein an acoustic-designing assistance program 10, speaker characteristic data (hereinafter referred to as "SP data") 107 obtained by FFT-transforming impulse responses etc. around speakers, equalizer data 108 that are data of equalizers suited for the speakers, speaker data table 109, and basic room shape data table 110.

The memory 105 has an area set for execution of the acoustic-designing assistance program 10 and an area set for temporarily storing (buffering) data generated in the acoustic-designing assistance processing. SP data 107, equalizer data 108, etc. are stored (buffered) in the memory 105. Note that the equalizer data 108 are data obtained by arithmetically operating settings of equalizers, intended to adjust frequency characteristics of sound signals output from the speaker array, in accordance with desired designing.

The sound output device 106 generates sound signals on the basis of sound source data stored in the HDD 104. The sound output device 106 contains a DSP (Digital Signal Processor) and D/A converter, and it has a signal processing function 1061 for equalizing, delaying, etc. the sound signals. For example, in a case where a sound field in a predetermined position of a sound receiving surface is to be confirmed auditorily, through headphones, speakers or the like, as results of simulation in the acoustic-designing assistance apparatus 1, sound signals having been subjected to signal processing are output to the headphones, speakers or the like.

Note that the sound output device 106 need not necessarily be in the form of hardware and may be implemented by software. The acoustic-designing assistance apparatus 1 may further include a sound signal input interface so that an externally-input sound signal can be output from the sound output device 106.

Here, the SP data 107 stored in the hard disk 104 are data of frequency characteristics of a plurality of types of speakers selectable in the acoustic-designing assistance apparatus 1. As explained above in relation to the response signal synthesis method, the audio frequency range of 0 Hz-22050 Hz are divided into nine analyzed bands on the octave-by-octave basis with 1000 Hz used as a standard unit of the octave-by-octave division, and data of the individual analyzed bands are stored, as the SP data 107B, in the hard disk 104. The divided frequency bands and FFT sizes of the individual analyzed bands are as shown in "Table 1" above. At the time of acoustic designing, the SP data pertaining to one direction, corresponding to a desired sound receiving point, from one speaker selected by a user are read out from the HDD 104 and stored into the memory 105. Such SP data stored in the memory 105 are indicated by reference numeral 107B, for convenience. SP data 107 pertaining to all of specific directions, corresponding to desired sound receiving points, from the individual speakers are stored in the HHD 104, and they are indicated by reference numeral 107A for convenience.

The speaker data table 109 is used as a database for selecting a speaker suited to a particular room (or venue or acoustic facility) when a shape and size of the room have been selected. As one example, the speaker data table 109 has stored therein data of speaker arrays, each comprising a plurality of speaker units. However, the acoustic-designing assistance apparatus 1 of the present invention is not necessarily limited to the application where a speaker array is used.

The basic room shape data table 110 comprises sets of names of shapes of rooms, coordinate data indicative of sizes of the rooms and image bit maps indicative of interior shapes of the rooms. The coordinate data also include data for setting shapes of spaces in the rooms.

Figure 4:
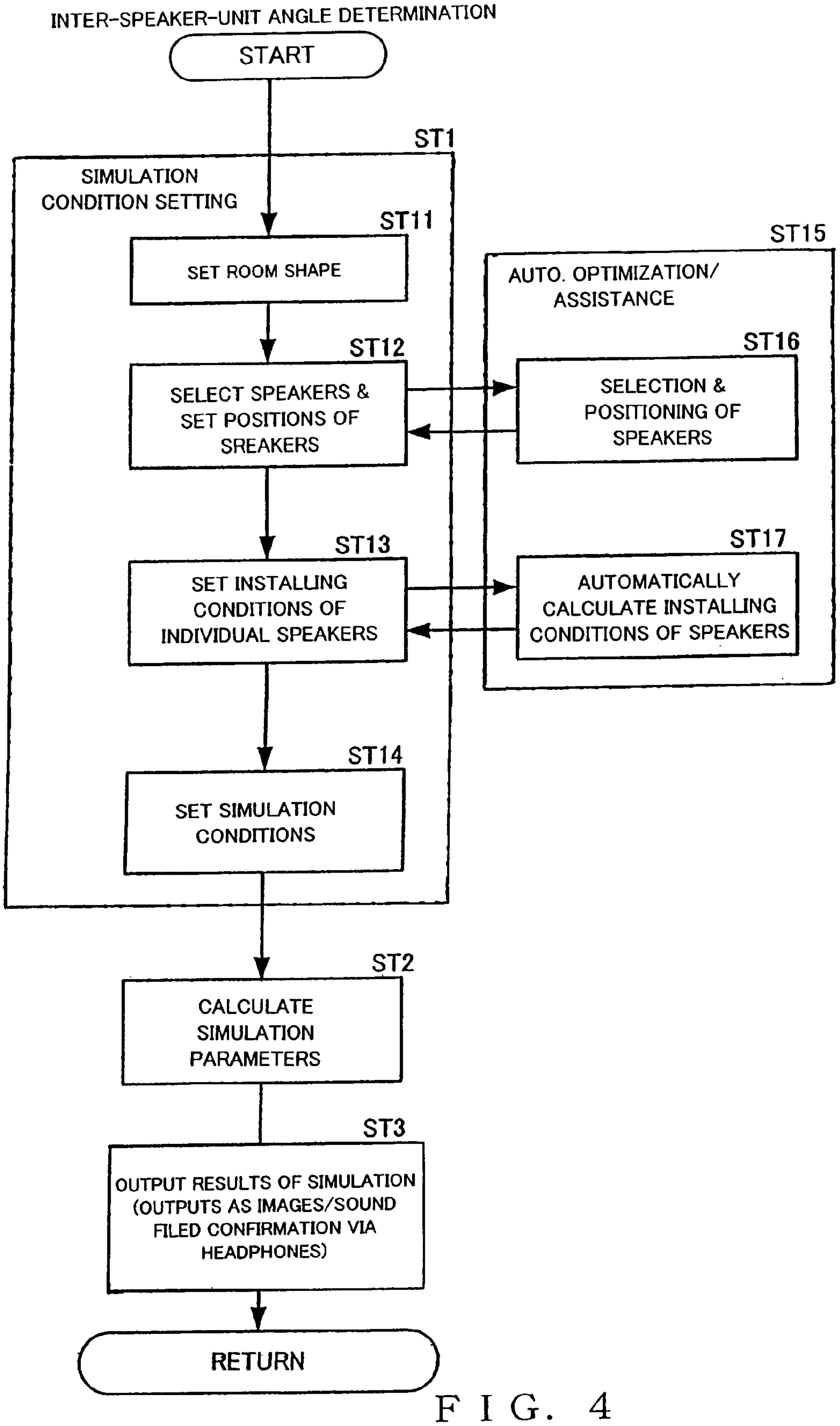
FIG. 4 is a flow chart showing general behavior of the acoustic-designing assistance apparatus.

FIG. 4 is a flow chart showing an example general operational sequence of designing assistance processing performed by the acoustic-designing assistance apparatus 1. The acoustic-designing assistance apparatus 1 performs three major steps ST1-ST3. At step ST1, conditions of simulation are set. At next step S2, parameter data, representative of characteristics with which to display results of simulation, are calculated on the basis of the set simulation conditions. At that time, SP data 107B pertaining to a specific direction are selected from among all of the direction-specific SP data 107A stored in the HDD 104, and equalizer data 108 are calculated.

At step ST3, the simulation results of the acoustic-designing assistance apparatus 1 are output to the display device 101 or headphones. The above-described response waveform synthesis method is applied when the simulation results are output, as a sound, to the headphones.

In the simulation condition setting operation of step ST1, various conditions necessary for the simulation are set at steps ST-ST14. Specifically, information of a space where speakers are to be installed, e.g. shape of a room (hereinafter referred to simply as "room shape") is set. More specifically, a general shape of the room is selected, and details of the shape are input in numerical values (see FIGS. 5 and 6). At step S12, speakers are selected, and settings are made as to where the selected speakers are to be installed. At step ST13, installing conditions of the individual selected speakers are set; the installing conditions are, for example, installation angles between the speaker units (hereinafter referred to also as "inter-speaker-unit installation angles") within the speaker array. At next step ST14, simulation conditions are set, such as a condition as to whether conditions of interference between the speaker units are to be taken into consideration, and a condition as to how finely grid points are to be arranged in the sound receiving surface (see FIG. 11).

Once all conditions are set in the condition setting operation of step ST1, the simulation is carried out at step ST2, and results of the simulation are displayed on the display device 101 or output via the headphones at step ST3.

Heretofore, it has been conventional for a human designer or engineer to find optimal designing by repeating the operations of step ST1-ST3 by trial and error. However, in the acoustic-designing assistance apparatus 1 of the present invention, setting data of the installation angles and characteristics of the speakers are automatically optimized and the setting is assisted at step S15, on the basis of the information of the room shape set at step S1.

The automatic optimization and assistance operation of step ST15 includes steps ST16 and ST17. At step ST16, speaker candidates, which can be used in the instant room, are displayed on the display device 101 from among the speakers registered in the speaker data table. When speakers have been selected via the operation selection 102, a possible scene where the selected speakers are positioned in the room shape selected at step S11 is displayed on the display device 101.

At step S17, an optimal combination pattern of angles (in horizontal and vertical directions) of the installed speaker array and optimal angles between the speaker units (i.e., inter-speaker-unit installation angles) are automatically calculated. Here, the angles of the speaker array, which become representative values of orientation axes of all of the speakers, indicate angles, in the horizontal and vertical directions, of the orientation axis of a desired reference speaker unit. The installation angle between the speaker units represents an angle (opening angle) between the adjoining speaker units.

The following paragraphs describe in greater detail steps ST11-ST17 included in the condition setting operation of step ST1, with reference to FIG. 5. Reference characters in the following figures generally correspond to the step numbers indicated in FIG. 4.

First, the room shape setting operation of ST11 is described with reference to FIGS. 5 and 6. FIG. 5 is a diagram showing an example of a GUI (Graphical User Interface) for setting a general shape of a room where speakers are to be positioned. The acoustic-designing assistance apparatus 1 displays, on the display device 101, a room shape setting screen 11A as shown in the figure, to allow the human designer to select an outline of the room where the speakers are to be installed. On an upper rear of the room shape setting screen 11A, there is shown a shape selection box 11C to allow the human designer to select one of fan and shoe-box shapes. Once the designer selects the "fan shape" by checkmarking "fan shape" in the shape selection box 11C via a not-shown mouse or the like, a plurality of examples of shapes of fan-shaped acoustic facilities etc. are displayed on a detailed shape selection box 11D. Thus, the user is allowed to select a desired one of the examples of shapes displayed on the detailed shape selection box 11D.

Once the human designer selects one of the examples of fan shapes displayed on the detailed shape selection box 11D, the displayed screen on the display device 101 switches from the room shape setting screen 11A of FIG. 5 to a room shape setting screen 11B of FIG. 6.

On the room shape setting screen 11B, the selected shape of the acoustic facility is displayed, as a drawing 11F, in a room shape display box 11E. This room shape setting screen 11B is displayed by the CPU 103 reading out a corresponding basic room shape data room from the basic room shape data table 110 stored in the HDD 104. On the screen, the human designer enters shape parameters that determine a size of the room where the speakers are to be positioned or installed.

On the room shape setting screen 11B, the human designer is allowed to enter, into a shape parameter input box 11G, the shape of the room where the speakers are to be positioned, in numerical values. Here, the human designer can set, through the numerical value entry, parameters pertaining to a width of a stage, height and depth of the acoustic facility, heights and sloping (inclination) angles of individual floors, etc. When the numerical values of the shape parameters have been changed through such input operations, the room shape indicated by the drawing 11F changes in accordance with the numerical value change. The parameters indicated in the shape parameter input box 11G are selected on the basis of the shape of the room (or acoustic facility). For example, where the room (or acoustic facility) is of a fan shape, there is displayed a field into which angles of the fan shape are to be entered. Further, where the room (or acoustic facility) has second and fourth floors, there is displayed a field where shape data of the second and third floors are to be entered. Parameters required in accordance with the room (or acoustic facility) shape are stored in association with the basic room shape data 110.

Once the human designer depresses a decision button 11H after having entered all shape parameters, the display on the display device 101 switches from the room shape setting screen of FIG. 6 to a speaker selection/installation setting screen 12 of FIG. 7 that corresponds to steps ST12 and ST16 of FIG. 4. On the speaker selection/installation setting screen 12 of FIG. 7, there are displayed a purpose-of-use selection box 12A, room shape display box 11E, shape data display box 12B, speaker installing position display box 12C and optimal speaker candidate display box 16.

In the room shape display box 11E, a room shape is displayed, in proportions of a virtually-actual room shape, on the basis of the room shape set via the screens of FIGS. 5 and 6.

The purpose-of-use selection box 12A is a display field for selecting a purpose of use of an acoustic facility or the like, via which the human designer can select either or both of "music" and "speech" by checkmarking "music" and/or "speech". Here, the purpose-of-use "music" is intended for acoustic designing that focuses on acoustic performance related to sound quality, such as frequency characteristics of a sound pressure level. The other purpose-of-use "speech" is intended for acoustic designing that focuses on acoustic performance related to clarity of a sound.

The speaker installing position display box 12C is a display field for selecting an approximate position where a speaker is to be installed. The human can select, as the approximate position, any one of "center of the stage", "right of the stage" and "left of the stage", by selecting any one of "Center", "Right" and "Left" in the speaker installing position display box 12C.

When the human designer has selected respective desired setting items in the purpose-of-use selection box 12A and speaker installing position display box 12C by checkmarking the items via the mouse or the like, an optimal speaker candidate is displayed in an optimal speaker candidate display box 16. The selection of the optimal speaker candidate corresponds to step ST16 of FIG. 4 and is automatically effected by the acoustic-designing assistance apparatus 1.

The CPU 103 selects an optimal speaker candidate from the speaker data table 109 stored in the hard disk 104. The speaker data table 109 is constructed in a manner shown in FIG. 8.

The speaker data table 109 has stored therein data suited for selection of an appropriate speaker on the basis of the information of the room shape set via the screens of FIGS. 5 and 6, and the stored data include data indicative of names of speaker types 109A, areas (i.e., area sizes) 109B, purposes of use 109C, installing positions 109D and horizontal-to-vertical ratios 109E.

If the area indicated by the shape data display box 12B (i.e., area of a sound receiving surface) is 450 $m^2$ and "Center" has been selected or checkmarked in the speaker installing position display box 12C, speaker D or speaker J can be selected from the speaker data table 109 as indicated in the optimal speaker candidate display box 16 of FIG. 7.

Now, with reference to FIG. 7, a description will be given about a GUI for displaying example states when a speaker array has been installed. One or more speaker candidates are displayed in a lower end field of the speaker position setting screen 12, and when one of the speaker candidates has been selected, the selected speaker array 16A is displayed in the room shape display box 11E on the same scale as the room shape 11F. In this way, it is possible to visually check how the speaker array 16A is positioned in the room. The displaying of the speaker array 16A too corresponds to step ST16 of FIG. 4. Step ST16 ends with the displaying of the speaker array 16A, and then control reverts to step ST12.

Further, when the speaker array 16A has been displayed, selection of a coverage zone of the speaker array 16A becomes possible via the room shape display box 11E. FIG. 7 shows a coverage zone 16E when half of a sound receiving surface in a first floor section of the room has been selected. Alternatively, the user is allowed to select the entire room, entire first floor section, entire second floor section or entire third floor section, the selection of which corresponds to step ST12 of FIG. 4. Then, at step ST17 of FIG. 4, the CPU 103 of the acoustic-designing assistance apparatus 1 sets speaker installing conditions, i.e. angles of the speaker array and installation angles between the individual speaker units of the speaker array.

Figure 9:
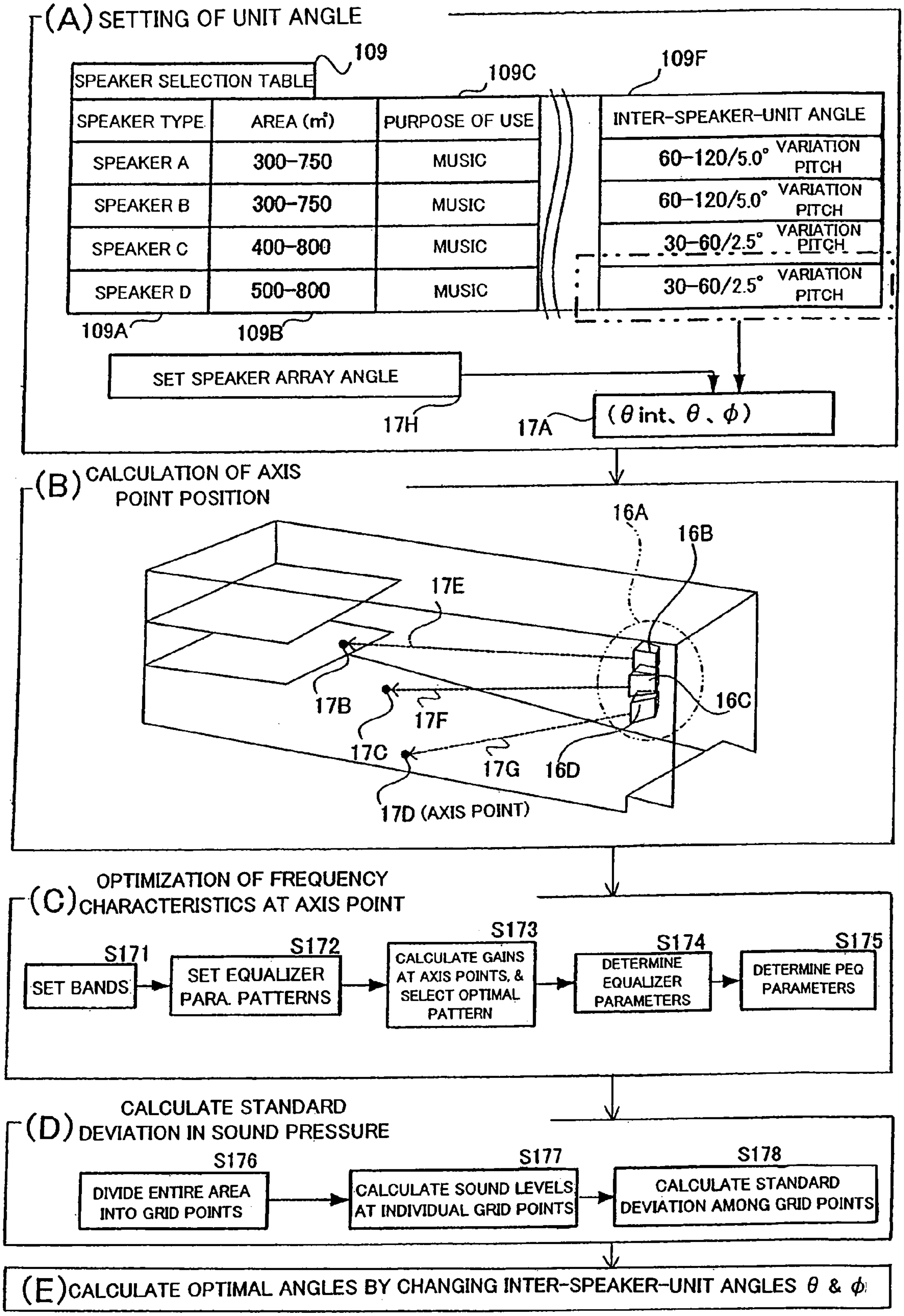
FIG. 9 is a conceptual diagram explanatory of an operational sequence for automatically calculating settings of installation angles between speaker units of a speaker array.

The following paragraphs describe in greater detail step ST17, with reference to FIGS. 9-13. FIG. 9 is a conceptual diagram explanatory of an operational sequence for automatically calculating settings of the angles of the speaker array and installation angles between the speaker units of the speaker array.

The calculations performed at step ST17 of FIG. 4 comprise five calculation steps (A)-(E). These calculations are carried out to determine optimal values of the angles of the speaker array and installation angles between the speaker units of the speaker array in the case where the speaker array 16A selected in FIG. 7 has been installed. As the optimal values, there are employed values capable of most effectively achieving "uniformization and optimization of sound pressure levels in a selected sound receiving surface". More specifically, values capable of minimizing standard deviation in sound pressure levels among grid points set over the entire sound receiving surface, as indicated in (D) of FIG. 9.

In the calculation operation of step ST17, optimization is performed on frequency characteristics of sound pressure levels at axis points 17B, 17C and 17D that are intersecting points between axis lines (corresponding to orientations) of the speakers and the sound receiving surface.

As shown in (A) of FIG. 9, settings of the installation angles between the speaker units of the speaker array are made by reading out, from the speaker data table 109 of FIG. 8, possible installation angles between speaker units which the speaker array 16A selected in FIG. 7 can take and then selecting from among the read-out possible installation angles. Such installation angles between speaker units are specific or peculiar to individual speaker arrays, and, at the time of actual installation, the installation angles between the speaker units are set via jigs of the speaker array 16A.

For convenience of description, the installation angles between the speaker units are indicated by θ int. Further, it is necessary to set angles, in both of the horizontal and vertical directions, of the speaker array to be installed, and such a combination of the angles in the horizontal and vertical directions is indicated by (θ, ϕ). Here, the installation angle in the horizontal direction θ is in a range of $-180° < \theta \leq 180°$, while the installation angle in the vertical direction ϕ is in a range of $-90° < \theta \leq 90°$. The installation angles between the speaker units are determined by these angles (θ int, θ, ϕ).

(B) of FIG. 9 shows a case where a speaker array comprising three speaker units is used. In this case, it is necessary to set two types of installation angles θint, i.e., a relative angle θint1 between the speaker units 16B and 16C and a relative angle θint2 between the speaker units 16C and 16D.

In order to set the installation angles between the speaker units, the apparatus searches for angles (θ, ϕ) of the speaker array and inter-speaker-unit installation angles θint (i.e., θint1 and θint2) which can minimize the aforementioned standard deviation, while sequentially varying the angles as shown in (E) of FIG. 9. For the inter-speaker-unit installation angles θint (i.e., θint1 and θ int2), an angle variation pitch (or minimum unit of the angle variation) is determined on the basis of the speaker data table 109. Program may be designed such that the angles are varied with a greater angle variation pitch in an initial search stage, in order to reduce the necessary calculation time.

Number of patterns or combinations of settable angles (θint, θ, Φ) is explained below with some specific examples. When a speaker type D has been selected, as the speaker type name 109A, from speaker candidate display box 16, the angles of the speaker array are sequentially varied, 30° at a time (i.e., with a 30° variation pitch), within the ranges of $-180° < \theta \leq 180°$ and $-90° < \theta \leq 90°$ as indicated in (A) of FIG. 9. Further, for the individual speaker units, the inter-unit installation angle can be sequentially varied, 2.5° at a time (i.e., with a 2.5° variation pitch), within the range of 30° to 60°. Namely, the angles (θint, θ, ϕ) are set by 180° being set as the angle θ, 90° as the angle ϕ and 60° as the angle θint, as indicated at 17A in (A) of FIG. 9. In this case, the angle θ can be set to twelve different values within the −180°-180° range because the angle is varied with the 30° variation pitch, and the angle ϕ can be set to seven different values within the −90°-90° range because the angle is varied with the 30° variation pitch. Further, with the speaker type D, for which the original settable range is 30 degrees (30°-60°) and the variation pitch is 2.5° as shown in FIG. 8, the angle θint can be set to thirteen different angles (i.e., $(60-30)/2.5+1=13$). Further, because there are two types of angles θint, i.e. θint1 and θint2, $13^2$ combinations are possible. Thus, the total of settable angle combinations amounts to 14,196 (i.e., $12\times7\times(13\times13)=14{,}196$). Further, because, in general, the upper and lower speaker units 16B and 16D are installed in horizontally-symmetric combination with respect to the middle speaker unit 16C, the settable angle combinations can be calculated assuming "θint1=θint2", so that the total of settable angle combinations amounts to 12×7×13=1,092.

Then, the frequency characteristics of the sound pressure levels at the axis points determined in (B) of FIG. 9 are optimized as shown in (C) of FIG. 9. Because the frequency characteristic optimization shown in (C) of FIG. 9 will be later explained in detail with reference to FIGS. 10A and 10B, it is explained here only briefly. The frequency characteristic optimization shown in (C) of FIG. 9 is intended to allow the index calculation shown in (D) of FIG. 9 to be performed with an enhanced efficiency; in other words, the frequency characteristic optimization is intended to "determine equalizer characteristics for uniformizing sound pressure levels between the axis points 17B, 17C and 17D and frequency characteristics thereof. Because the individual speaker units 16B, 16C and 16D of the speaker array 16A generally have broad directional characteristics, a sound of the speaker unit 16D also reaches the axis point 17B, and a sound of the speaker unit 16B also reaches the axis point 17D. Thus, in a case where a sound volume at the axis point 17B is relatively small, and if only operation is performed for merely increasing the sound pressure level of the speaker unit 16B, sound volumes at the other axis points 17C and 17D too increase, which would result in unwanted imbalance. Therefore, in the apparatus according to the instant embodiment, there are prepared patterns of equalizer parameters of the individual speaker units 16B, 16C and 16D. Further, in the apparatus, frequency characteristics of sounds transmitted from the individual speaker units 16B, 16C and 16D of the speaker array 16A, installed at the angles set in (A) of FIG. 9, and received at the axis points 17B, 17C and 17D are calculated using the aforementioned SP data 107 of FIG. 3 (i.e., data obtained by FFT-transforming impulse responses at all angles around the speakers), to thereby select an optimal pattern. Operational flow shown in (C) of FIG. 9 is described below.

First, at step S171, reference frequency bands fi (fi represents discrete values (i=1−N) are set. In this case, the reference frequency bands fi can be set to any of 62.5 Hz, 125 Hz, 250 Hz, 500 Hz, 1 kHz, 2 kHz and 8 kHz in accordance with channels of parametric equalizers.

At next step S172, equalizer parameter patterns (G1, G2, G3) fiHz for adjusting gains of the reference frequency bands are set for the individual speaker units 16B, 16C and 16D.

For the thus-set equalizer parameter patterns, frequency characteristics of sound pressure levels at the aforementioned axis points 17B, 17C and 17D are calculated and then an optimal pattern, capable of minimizing dispersion or variation among the axis points 17B, 17C and 17D in each of the reference frequency bands is selected, at next step S173. More specifically, dispersion among the axis points 17B, 17C and 17D is calculated for each of the reference frequency bands, and then a square root of an absolute value of the dispersion is calculated to thereby calculate standard deviation for each of the reference frequency bands. Such standard deviation indicates degree of variation in gain of a particular frequency, and a smaller value of the standard deviation indicates smaller variation in gain. Therefore, an equalizer parameter pattern presenting smaller standard deviation can be said to be a more appropriate equalizer parameter pattern.

Then, an optimal equalizer parameter pattern (G1, G2, G3) fiHz is selected independently per frequency. Through the aforementioned operations, equalizer parameters for the speaker units 16B, 16C and 16D are determined at step S174.

Although the optimal equalizer parameter pattern has been selected per frequency through the aforementioned parameter determining steps, the thus-determined equalizer parameters are set as equalizer parameters (PEQ parameters) per peak, not per frequency, in order to be set in the parametric equalizers (step S175.) Then, data indicative of the thus-set equalizer parameters (PEQ parameters) are stored into the external storage device 104 and/or the like for the individual speaker units 16B, 16C and 16D.

In the operational stage or process shown in (C) of FIG. 9, sound level optimization is also performed on the basis of the SP data 107 although not specifically shown.

Further, the equalizer parameters calculated in the manner as shown in (C) of FIG. 9 are subjected to FFT transformation, and the thus FFT-transformed equalizer parameters are stored, as the equalizer data 108, into the external storage device 104 of FIG. 3. In this way, simulation parameters can be calculated, in the simulation parameter calculation operation of step ST2, by only performing convoluting calculations in the frequency domain, and the calculation results can be output promptly. In many case, the acoustic-designing assistance apparatus executes optimal designing by repetitively performing simulations while changing simulating conditions many times as noted above; for such an acoustic-designing assistance apparatus, it is very effective to FFT-transform the equalizer parameters.

In (D) of FIG. 9, standard deviation of sound pressure levels in the sound receiving surface area is calculated on the basis of the PEQ parameters of the individual speaker units 16B, 16C and 16D, and sound pressure levels in the sound receiving surface area and their frequency characteristics are calculated. For these purposes, operations of steps S176-S178 are performed as follows.

Figure 11:
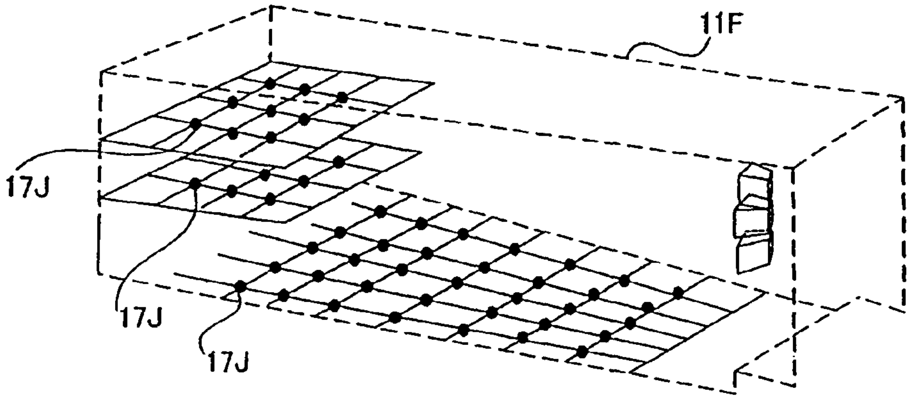
FIG. 11 is a diagram showing an example sound receiving surface area divided by grid points.

At step S176, a plurality of grid points 17J are set in the entire cover area of the acoustic facility, as shown in FIG. 11. Acoustic designing of the entire sound receiving surface area is carried out using the grid points 17J as sample sound receiving points.

At step S177, sound levels at the individual grid points 17J are determined on the basis of the SP data 107 of FIG. 8 etc. More specifically, the sound levels are determined by convoluting, for each of the speaker units, the FFT-transformed equalizer data 108 with the SP data 107B of the corresponding direction and then additively synthesizing the outputs from the individual speakers.

At next step S178, standard deviation α is calculated regarding the sound levels at the individual grid points 17J having been determined at step S177. Smaller value of the standard deviation α is more preferable in that it can achieve smaller variation among the points in the entire sound receiving surface.

In (E) of FIG. 9, the processes of (A)-(D) of FIG. 9 are repeated after resetting or changing the horizontal and vertical angles (θi, ϕi) of the speaker units 16B, 16C and 16D. Through the repetition of the processes, an angle setting pattern is selected which can minimize the standard deviation determined in the manner shown in (D) of FIG. 9. In such a case, the angle search is carried out with the angle variation pitch of the to-be-installed speaker array initially set to a relatively great value and then set to smaller values, in order to reduce the necessary calculating time.

As described above, the calculations of the optimal angles of the speaker array and angles among the individual speaker units comprise setting an angle pattern as shown in (A) of FIG. 9, then calculating standard deviation of the sound levels (i.e., index indicating degree of sound pressure dispersion or variation) in the sound receiving surface area as shown in (D) of FIG. 9, and finding a minimum value of the standard deviation. For these purposes, axis points 17B, 17C and 17D are set as representative points in the respective coverage zones of the individual speaker units. Then, equalizer characteristics for optimizing frequency characteristics at the axis points 17B, 17C and 17D are determined as shown in (C) of FIG. 9 and applied to the corresponding speaker units.

Figure 10A:
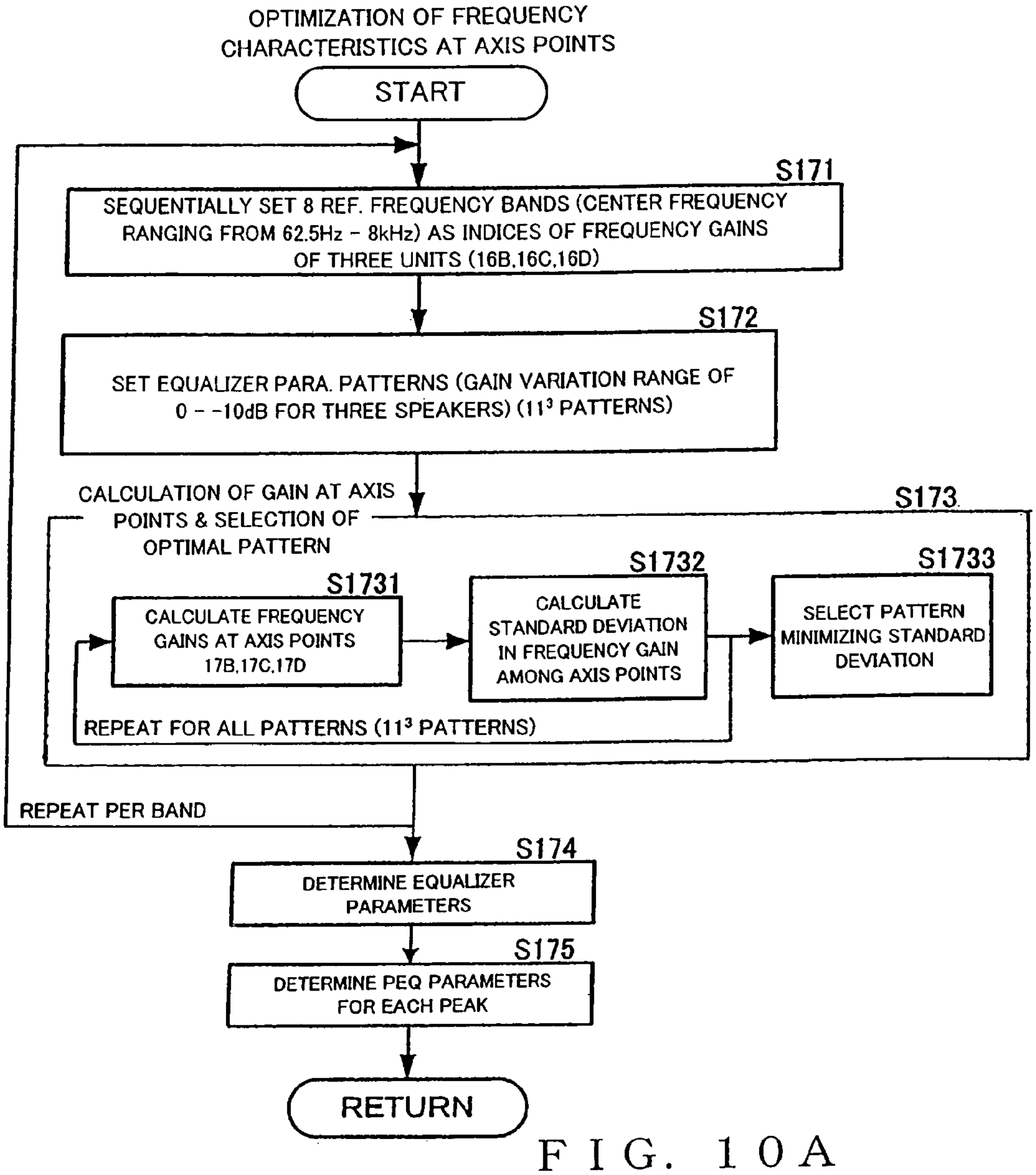
FIG. 10A is a flow chart showing a process for optimizing frequency characteristics at axis points of the individual speakers.
Figure 10B:
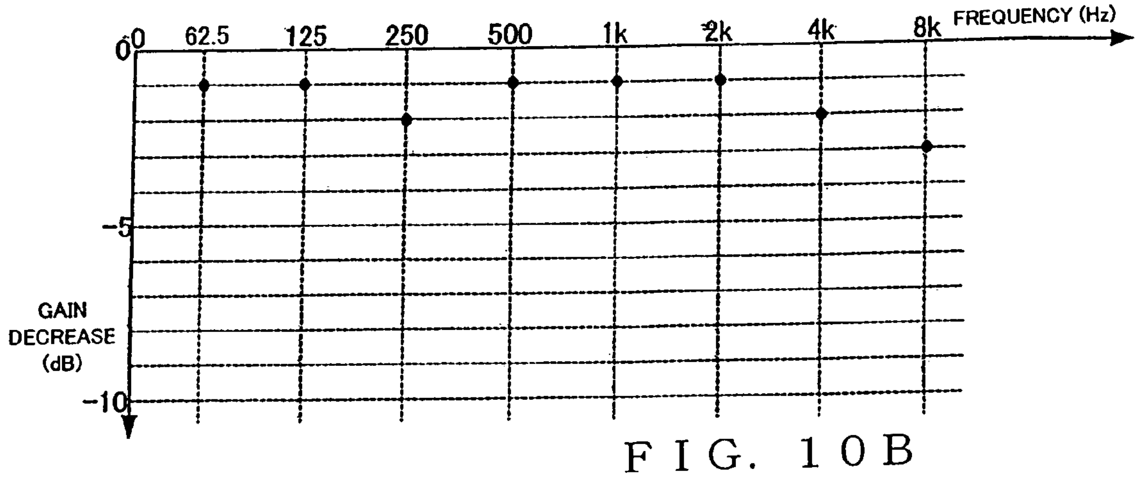
FIG. 10B is a diagram showing an example of equalizer parameter settings for use in the optimization of the frequency characteristics.

With reference to FIGS. 10A and 10B, the following paragraphs describe in greater detail the process shown in (C) of FIG. 9. FIG. 10A is a flow chart showing a process for optimizing frequency characteristics at the axis points as shown in (C) of FIG. 9, and FIG. 10B is a diagram showing an example of equalizer settings for use in the optimization of the frequency characteristics.

In FIG. 10A, the reference frequency band fi is sequentially set to eight band (62.5 Hz-8 kHz as noted above) as frequency gain indices of the three speaker units 16B, 16C and 16D (S171). The reference frequency band is the center frequency of each of the channels of the parametric equalizers, which is set, for example, to any one of 62.5 Hz, 125 Hz, 250 Hz, 500 Hz, 1 kHz, 2 kHz and 8 kHz as shown in FIG. 10B.

In the illustrated example, the gain setting patterns (G1, G2, G3) fiHz explained above in relation to step S172 shown in (C) of FIG. 9 are set to the range of 0 dB to −10 dB with one dB as a minimum unit. Therefore, $11^3$ patterns are set per reference frequency (e.g., 62.5 Hz), and thus, $8\times11^3$ patterns are set as a whole. Further, for each of the patterns, equalizer data having been FFT-transformed per speaker unit are stored as the equalizer data 108.

At step S173, gains at the axis points are calculated with each of the patterns, to select an optimal one of the patterns. This step can be divided into steps S1731-S1733.

At step S1731, frequency characteristics of sounds transferred from the speaker array 16A and received at the individual axis points 17B, 17C and 17D are calculated on the basis of the SP data 107 of FIG. 3 and data of frequency gains at the axis points are calculated and accumulated per reference frequency band fi.

The frequency gain calculation is performed, for each of the speaker units, by convoluting together all of data of a phase correction filer having been subjected to Fourier transformation and time delay; data of a distance decay correction filter having been subjected to Fourier transformation; equalizer data 108 having been subjected to Fourier transformation; and SP data 107B of a corresponding particular direction.

In the instant embodiment, where the number of the speaker units is three, the number of the frequency gain data to be accumulated is 24 (i.e., three speaker units×eight bands=24).

At step S1732, standard deviation among the frequency gain data at the three points is determined per reference frequency band fi.

At next step S1733, the operations of steps S1731-S1732 are repeated for all of the $11^3$ different patterns having been set at step S172 above, to find one of the patterns which is capable of minimizing the standard deviation.

Thus, through the operations of steps S1731-S1733, it is possible to determine, for each of the reference frequency bands, equalizer gains capable of minimizing the standard deviation in sound pressure level among the axis points 17B, 17C and 17D (these equalizer gains are represented by small black dots in FIG. 10B). By repeating these operations for all of the aforementioned eight reference frequency bands, an optimal equalizer gain pattern can be determined at step S174 of FIG. 10A. Then, parameters for the parametric equalizers (PEQ) are determined, at step S175, per peak on the basis of the determined equalizer gain pattern. As noted above in relation to (C) of FIG. 9, the parameters are reorganized and then stored into the external storage device 104 per speaker unit. After that, the operational flow of FIG. 10A is brought to an end.

Figure 12:
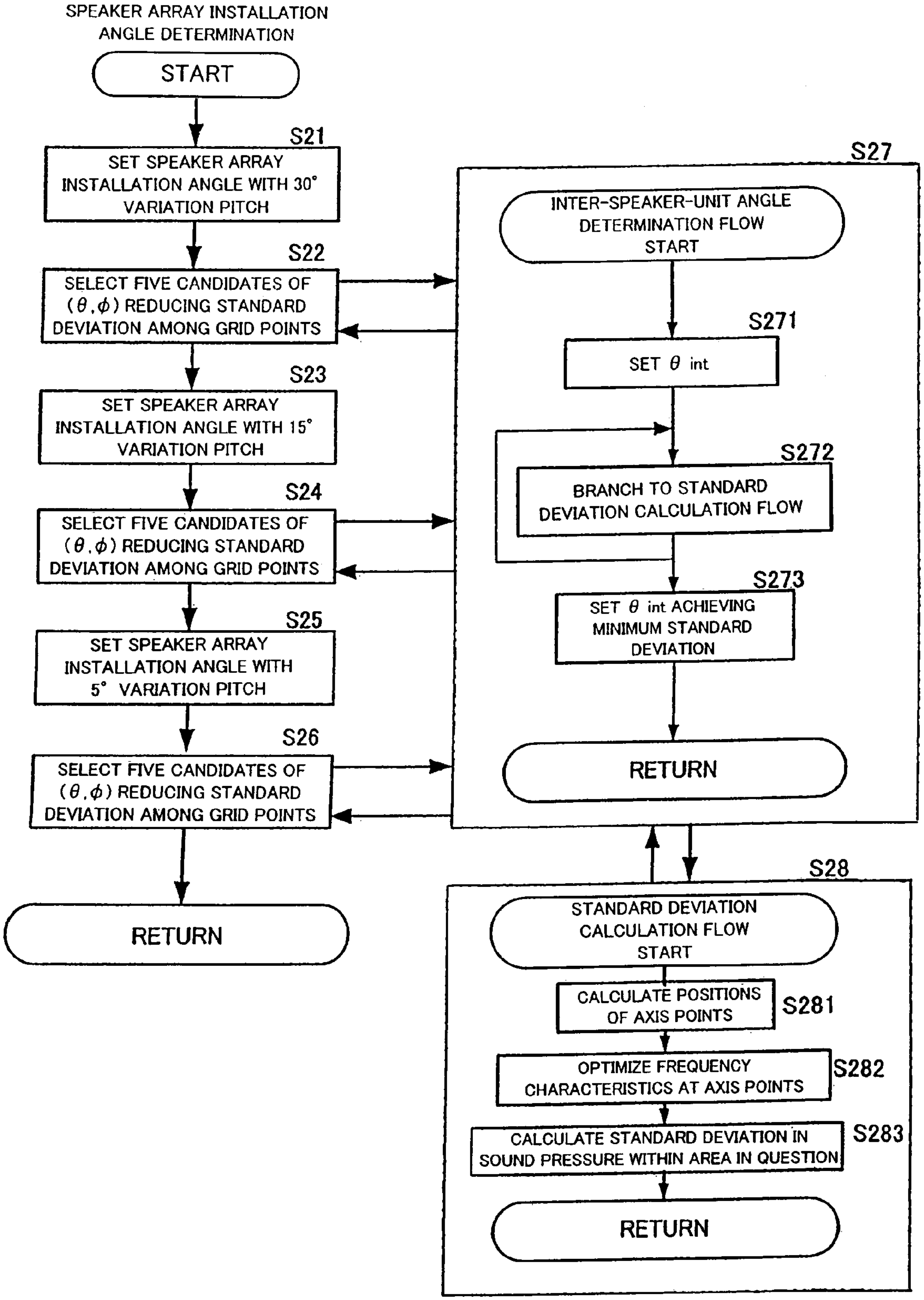
FIG. 12 is a flow chart showing an operational sequence for optimizing speaker angles.

With reference to a flow chart of FIG. 12, the following paragraphs describe in greater detail how the angles of the speaker array and installation angles between the speaker units of the speaker array are set and optimal angles are determined from among the set angles as shown in (A) and (E).

Steps S21-S26 correspond to the process shown in (A) of FIG. 9. At step S21, patterns of speaker array angles (θ, ϕ) are set with the 30° variation pitch for each of the horizontal and vertical directions. Further, installation angles θint between the individual speaker units are set for each of the speaker array angles. At that time, patterns of installation angles θint between the individual speaker units are prepared by selecting installation angles from the settable angle range specific to the speaker array 16A in question as mentioned above in relation to FIG. 8. Here, the angle θ is settable within the −180°<θ≤180° with the 30° variation pitch, and the angle ϕ is settable within the −90≤θ≤=90° with the 30° variation pitch.

Then, at step S22, five best angles patterns (θ, ϕ), which can achieve reduced standard deviation in sound level among the grid points (e.g., 17J of FIG. 11), are selected from among the set patterns. In selecting such five best angles patterns, it is necessary to set a plurality of inter-speaker-unit installation angles θint and then select an optimal one of the thus-set inter-speaker-unit installation angles θint. Therefore, a subroutine of step S27 is performed for each of the speaker array angle patterns.

The subroutine of step S27 comprises an inter-speaker-unit installation angle determination flow. First, at step S271, a plurality of inter-speaker-unit installation angles θint for the speaker array angle pattern (θ, ϕ) selected at step S22.

At next step S272 of the inter-speaker-unit installation angle determining flow, a standard deviation calculation flow of step S28 is performed for the angles (θint, θ, ϕ) set at steps S22 and S271. Here, each operation of step S28 is performed by varying only the angle θint with the angles (θ, ϕ) kept fixed. Steps S281-S283 of step S28 correspond to the processes shown in (B)-(D) of FIG. 9 and thus will not be described here to avoid unnecessary duplication.

At following step S273, an inter-speaker-unit installation angles θint achieving the minimum standard deviation is extracted from the calculated results at step S272. After that, the subroutine of step S27 is temporarily brought to an end, and then it is resumed with the set of angles (θ, ϕ) switched over to another set.

Then, for each of the five angle patterns (θ, ϕ) selected at step S22 above, combinations of angles that are 15° before and behind the individual angles of the pattern are newly set, at step S23. For example, if the optimal values of the angles (θ, ϕ) of a given one of the selected best five angle patterns are 30° and 45°, a pattern of the optimal angles 30° and 15° and 45° that are 15° before and behind the optimal angle 30° (namely, pattern of 15°, 30° and 45°) is newly set for θ. Further, a pattern of the optimal angles 45° and 30° and 60° that are 15° before and behind the optimal angle 45° (namely, pattern of 30° 45° and 60°) is newly set for ϕ (nine different patterns). Thus, a total of (5×9) different patterns of (θ, ϕ) can be set. In the aforementioned subroutine of step S27, inter-speaker-unit installation angles θint are set for each of the thus-set angle patterns (θ, ϕ), to optimize the installation angles θint.

At step S24, five best angles patterns (θ, ϕ), which can achieve reduced standard deviation in sound level among the grid points (e.g., 17J of FIG. 11), are selected from among the patterns newly set at step S23, in generally the same manner as at step S22.

Step S25 is similar to step S23 but different therefrom in that combinations of angles that are 5° (not 15°) before and behind the individual angles of the selected pattern are newly set. For example, if the optimal angle θ of a given one of the selected best five angle patterns is 45°, a pattern of 40°, 45° and 50°) is newly set for θ.

At step S26, (θint, θ, ϕ) is determined for the angles set at step S25 using the subroutine of step S27, in generally the same manner as at step S22 or S24. However, unlike step S22 or S24, this step S26 selects one (not five) best angle pattern (θ, ϕ), to ultimately determine (θint, θ, ϕ).

As described above, the angle search is carried out in the instant embodiment with the angle variation pitch of the to-be-installed speaker array initially set to a relatively great value and then set to smaller values, so that the necessary searching time can be reduced. Further, such an angle search can prevent the calculations from becoming impossible due to order of calculation cost.

As seen from the foregoing, the condition setting and automatic optimization/assistance, provided by the instant embodiment in the manner described above in relation to FIGS. 4-12, can substantially automatize the condition setting that was optimized in the past by trial and error. Further, by acoustically outputting the results of the optimization at step ST3 of FIG. 4, the instant embodiment allows the optimization results to be confirmed through headphones.

Note that the numerical values, number of speaker units, fan or rectangular shoe-box shape of FIG. 5, GUI of FIGS. 6-7, operational flows shown in some of the figures, etc. are just illustrative examples and the present invention is, of course, not so limited. Particularly, the condition setting and pattern setting processes have been shown and described as parts of the repeated operational flows, but, once set, such conditions and patterns need not be set again and again in the repeated routine.

Figure 13:
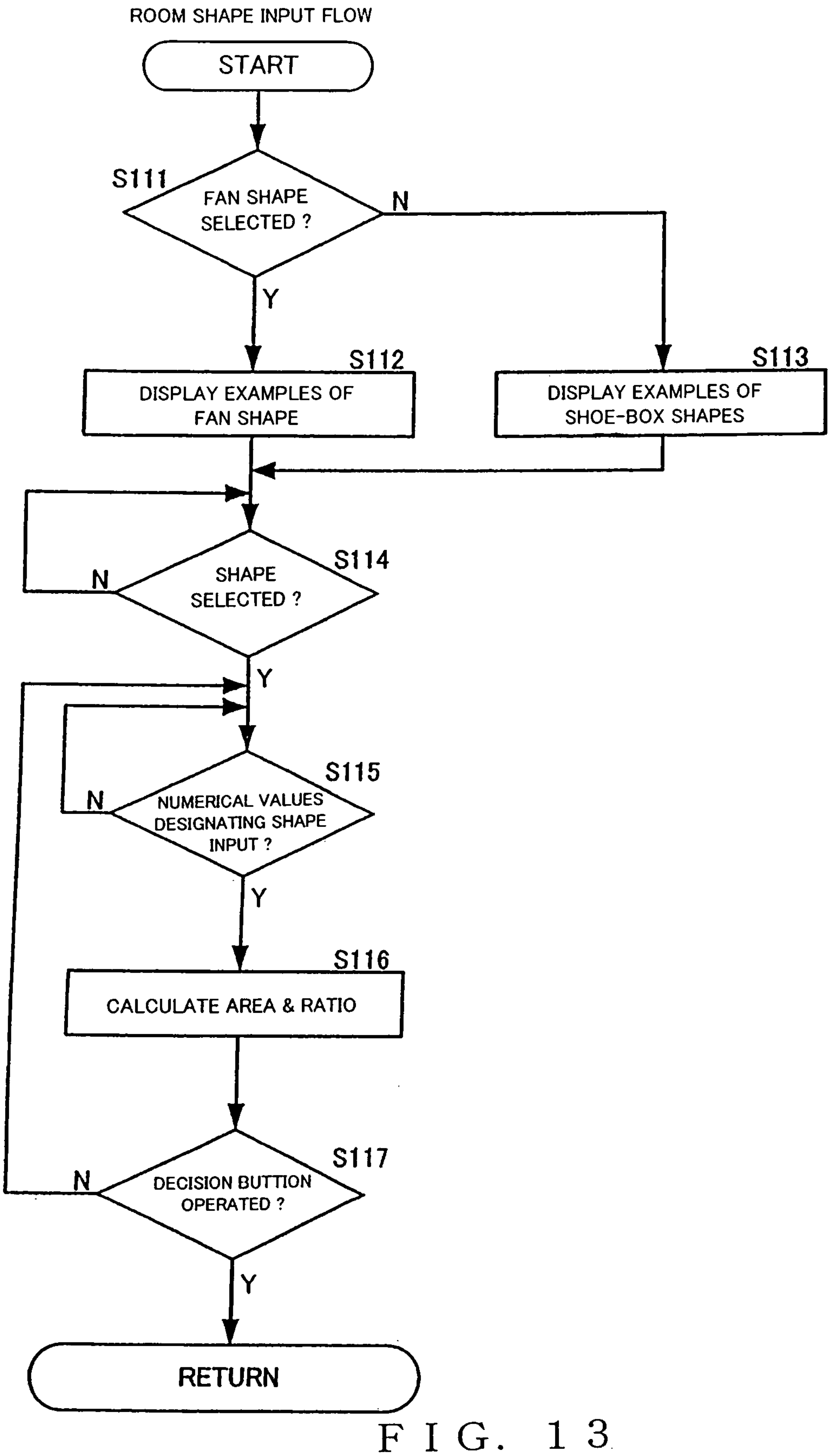
FIG. 13 is a flow chart showing behavior of the acoustic-designing assistance apparatus when GUI screens of FIGS. 5 and 6 are being displayed.

Now, with reference to a flowchart of FIG. 13, the following paragraphs describe behavior of the acoustic-designing assistance apparatus when the room shape setting screens of FIGS. 5 and 6 are being displayed. The operational flow of FIG. 13 corresponds to the room shape setting operation of step ST11 shown in FIG. 4.

First, the shape selection box 11C is displayed as shown in FIG. 5, and a determination is made, at step S111, as to whether the fan shape or the shoe-box shape has been selected. If the fan shape has been selected, a YES determination is made at step S111, so that a plurality of examples of the fan shape as shown in FIG. 3 are displayed in the shape selection box 11D. If the selected shape is not a fan shape, a NO determination is made at step S111, so that a plurality of examples of the shoe-box shape (not shown) are displayed.

At step S114, a determination is made as to whether any shape has been selected from the fan shape section box 11D at step S112 or from the shoe-box shape selection box at step S113. If no shape has been selected, a NO determination is made at step S114, and thus the apparatus stands by. If any shape has been selected as determined at step S114, the screen of the display device 101 is switched to another screen, after which control goes to next step S115.

At step S115, a determination is made as to whether numerical values have been input to designate a shape of a room. If all of predetermined numerical values have not been input, a NO determination is made at step S115, and the apparatus stands by until all of the numerical values have been input. Once all of the numerical values have been input, a planar area size and vertical-to-horizontal ratio of the room are calculated, at step S116, on the basis of the numerical values input at step S115.

At step S117, it is determined whether the decision button 11H has been depressed. If the decision button 11H has been depressed as determined at step S117, the operational flow is brought to an end. If the decision button 11H has not been depressed as determined at step S117, control reverts to step S115 to receive any desired change to the input numerical values until the decision button 11H is depressed.

Figure 14:
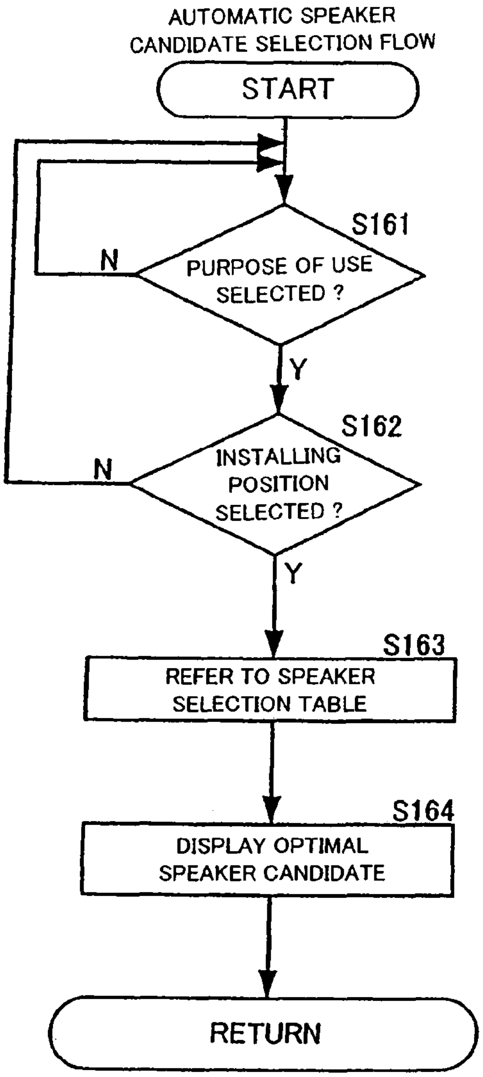
FIG. 14 is a flow chart showing behavior of the acoustic-designing assistance apparatus when a speaker selection screen of FIG. 7 is being displayed.

Next, with reference to a flow chart of FIG. 14, a description is made about behavior of the acoustic-designing assistance apparatus of the invention when the speaker selection screen 12 of FIG. 7 is being displayed.

At steps S161 and S162, it is determined whether desired items have been selected in the purpose-of-use selection box 12A and speaker installing position selection box 12C of the speaker section screen 12. If no selection has been made in the aforementioned boxes, NO determinations are made at step S161 and S162, and then the apparatus stands by. If a YES determinations have been made at both of steps S161 and S162, control proceeds to step S163.

At step S163, a speaker array satisfying the conditions input at steps S161 and S162 is selected, and the thus-selected speaker array is displayed as an optimal speaker candidate as shown in FIG. 7 (step S164).

What is claimed is:

1. A response waveform synthesis method comprising:

an inverse FFT step, performed by a processor, of using frequency characteristics stored on a frequency characteristic storage, determined for individual ones of a plurality of analyzed bands divided from a predetermined audio frequency range, to set a plurality of synthesized bands in such a manner that each of the synthesized bands is set by using two frequency characteristics respectively of two adjoining analyzed bands of the plurality of analyzed bands, the two frequency characteristics determined respectively through two different frequency resolution values, and in such a manner that a part of each synthesized band overlaps with a part of another adjoining synthesized band on a frequency axis and then determining a time-axial response waveform for each of the synthesized bands, said frequency characteristics being determined, for the individual analyzed bands, with frequency resolution that becomes finer in order of lowering frequencies of the analyzed bands; and an additive synthesis step, performed by the processor, of adding together the response waveforms of the synthesized bands, to thereby provide a response waveform for a whole of the audio frequency range.

2. A response waveform synthesis method as claimed in claim 1 wherein said inverse FFT step uses the frequency characteristics, determined for the individual analyzed bands (0-n) divided from the audio frequency range, to determine the time-axial response waveform for each of the synthesized bands i (i=1, 2, . . . , n) having a frequency band of an (i−1)-th analyzed band and a frequency band of an i-th analyzed band, and said additive synthesis step adds together the response waveforms of the synthesized bands i (i=1, 2, . . . , n) determined by said inverse FFT step, to thereby provide the response waveform for the whole of the audio frequency range.

3. A response waveform synthesis method as claimed in claim 2 wherein said inverse FFT step determines the response waveform for each of the synthesized bands i (i=1, 2, 3, . . . , n), using a frequency characteristic value obtained by multiplying a portion of the synthesized band, corresponding to the (i−1)-th analyzed band, by a sine square function ($\sin^2 \theta$) as a rise portion of the waveform and a frequency characteristic value obtained by multiplying a portion of the synthesized band, corresponding to the i-th analyzed band, by a cosine square function ($\cos^2 \theta$) as a fall portion of the waveform.

4. A response waveform synthesis method as claimed in claim 2 wherein 1st to (n−1)-th said analyzed bands are divided from the audio frequency range on an octave-by-octave basis, and the frequency characteristic of each of the analyzed bands is determined through FFT analysis, and wherein a number of FFT sample data to be used in the FFT analysis of k-th said analyzed band (k=1, 2, . . . , n−2) is double a number of FFT sample data to be used in the FFT analysis of (k+1)-th said analyzed band.

5. A response waveform synthesis method as claimed in claim 4 wherein, in said inverse FFT step, a portion of the synthesized band i (i=1, 2, 3, . . . , n−1), corresponding to the (i−1)-th analyzed band, uses frequency characteristic values, discretely present on a frequency axis, in a thinned-out manner so that the frequency characteristic values equals in number to frequency characteristic values discretely present on the frequency axis in a portion corresponding to the i-th synthesized band.

6. A response waveform synthesis apparatus comprising:

a frequency characteristic storage storing frequency characteristics determined for individual ones of a plurality of analyzed bands divided from a predetermined audio frequency range, said frequency characteristics being determined with frequency resolution that becomes finer in order of lowering frequencies of the analyzed bands; and a processor performing the operations of:

an inverse FFT operation section that sets a plurality of synthesized bands in such a manner that each of the synthesized bands is set by using two frequency characteristics respectively of two adjoining analyzed bands of the plurality of analyzed bands, the two frequency characteristics determined respectively through two different frequency resolution values, and in such a manner that a part of each synthesized band overlaps with a part of another synthesized band adjoining the same on a frequency axis and then determines a time-axial response waveform for each of the synthesized bands; and an additive synthesis section that adds together the response waveforms of the synthesized bands, to thereby provide a response waveform for a whole of the audio frequency range.

7. A response waveform synthesis apparatus as claimed in claim 6 wherein said inverse FFT operation section uses the frequency characteristics, determined for the individual analyzed bands (0-n) divided from the audio frequency range, to determine the time-axial response waveform for each of the synthesized bands i (i=1, 2, . . . , n) having a frequency band of an (i−1)-th analyzed band and a frequency band of an i-th analyzed band, and said additive synthesis section adds together the response waveforms of the synthesized bands i (i=1, 2, . . . , n) determined by said inverse FFT operation section, to thereby provide the response waveform for the whole of the audio frequency range.

8. A response waveform synthesis apparatus as claimed in claim 6 which further comprises:

a characteristic storage section storing respective characteristics of a plurality of types of speakers;

a speaker selection assistance section that selects selectable speaker candidates on the basis of information of a shape of a room where speakers are to be positioned;

a speaker selection section that receives selection operation for selecting one speaker from among the selectable speaker candidates;

a speaker installation angle optimization section that, on the basis of a characteristic of the speaker selected via said speaker selection section, determines such an installing orientation of the speaker as to minimize variation in sound level at individual positions of a sound receiving surface of the room; and a frequency characteristic calculation section that calculates, for each of the plurality of analyzed bands divided from the audio frequency range, a frequency characteristic at a predetermined position of the room on the basis of the information of the shape of the room and the installing orientation of the speaker determined by said speaker installation angle optimization section, wherein said frequency characteristic storage stores the frequency characteristic calculated by said frequency characteristic calculation section for each of the analyzed bands.

9. A response waveform synthesis apparatus as claimed in claim 8 which further comprises a sound signal processing section including a filter having set therein a characteristic of the response waveform for the whole of the audio frequency range provided by said additive synthesis section, and wherein a desired sound signal is inputted to said sound signal processing section so that the inputted sound signal is processed by the filter and then the processed sound signal is outputted from said sound processing section.

10. A response waveform synthesis apparatus as claimed in claim 8 wherein said inverse FFT operation section uses the frequency characteristics, determined for individual ones of the plurality of analyzed bands (0-n) divided from the audio frequency range, to determine the time-axial response waveform for each of the synthesized bands i (i=1, 2, . . . , n) having a frequency band of an (i−1)-th analyzed band and a frequency band of an i-th analyzed band, and said additive synthesis section adds together the response waveforms of the synthesized bands i (i=1, 2, . . . , n) determined by said inverse FFT operation section, to thereby provide the response waveform for the whole of the audio frequency range.

11. A non-transitory computer-readable storage medium containing a group of instructions for causing a computer to perform a response waveform synthesis program, said response waveform synthesis program comprising:

a first step of selecting selectable speaker candidates on the basis of information of a shape of a room where speakers are to be positioned;

a second step of receiving selection operation for selecting one speaker from among the selectable speaker candidates;

a third step of, on the basis of a characteristic of the speaker selected via said second step, selecting such an installing orientation of the speaker as to minimize variation in sound level at individual positions of a sound receiving surface of the room;

a fourth step of calculating, for each of a plurality of analyzed bands divided from a predetermined audio frequency range, a frequency characteristic at a predetermined position of the room on the basis of the information of the shape of the room and the installing orientation of the speaker determined by said third step;

an inverse FFT step of setting a synthesized band for every adjoining two of the analyzed bands in such a manner that a part of each synthesized band overlaps with a part of another synthesized band adjoining the same on a frequency axis and then determining a time-axial response waveform for each of the synthesized bands; and an additive synthesis step of adding together the response waveforms of the synthesized bands, to thereby provide a response waveform for a whole of the audio frequency range.

12. A computer-readable storage medium as claimed in claim 11 which further comprises:

a step of setting a characteristic of the response waveform for the whole of the audio frequency range, provided by said additive synthesis step, in a filter; and a step of inputting a desired sound signal, processing the inputted sound signal by means of the filter and then outputting the processed sound signal.

13. A computer-readable storage medium as claimed in claim 11 wherein said fourth step calculates frequency characteristics of the individual analyzed bands with frequency resolution that becomes finer in order of lowering frequencies of the analyzed bands.

14. A computer-readable storage medium as claimed in claim 11 wherein said inverse FFT step uses the frequency characteristics, determined for individual ones of the plurality of analyzed bands (0-n) divided from the audio frequency range, to determine the time-axial response waveform for each of the synthesized bands i (i=1, 2, . . . , n) having a frequency band of an (i−1)-th analyzed band and a frequency band of an i-th analyzed band, and said additive synthesis step adds together the response waveforms of the synthesized bands i (i=1, 2, . . . , n) determined by said inverse FFT step, to thereby provide the response waveform for the whole of the audio frequency range.

* * * * *